(12) United States Patent
Nam et al.

(10) Patent No.: US 11,164,874 B2
(45) Date of Patent: Nov. 2, 2021

(54) SEMICONDUCTOR DEVICE AND METHOD FOR FABRICATING THE SAME

(71) Applicant: XIA TAI XIN SEMICONDUCTOR (QING DAO) LTD., Qingdao (CN)

(72) Inventors: Chang-Hyeon Nam, Singapore (SG); Injoon Yeo, Singapore (SG)

(73) Assignee: XIA TAI XIN SEMICONDUCTOR (QING DAO) LTD., Qingdao (CN)

(*) Notice: Subject to any disclaimer, the term of this patent is extended or adjusted under 35 U.S.C. 154(b) by 0 days.

(21) Appl. No.: 16/660,734

(22) Filed: Oct. 22, 2019

(65) Prior Publication Data

US 2020/0219882 A1 Jul. 9, 2020

Related U.S. Application Data

(60) Provisional application No. 62/781,659, filed on Dec. 19, 2018.

(51) Int. Cl.
| | |
|---|---|
| *H01L 21/768* | (2006.01) |
| *H01L 27/108* | (2006.01) |
| *H01L 49/02* | (2006.01) |

(52) U.S. Cl.
CPC .. *H01L 27/10817* (2013.01); *H01L 21/76829* (2013.01); *H01L 27/10855* (2013.01); *H01L 28/88* (2013.01)

(58) Field of Classification Search
CPC ........... H01L 21/3116; H01L 21/67075; H01L 21/0268; H01L 21/76829; H01L 21/76804; H01L 21/8239; H01L 21/8229; H01L 27/10817; H01L 28/88; H01L 27/10855; H01L 27/10852; H01L 28/90; H01L 27/10847; H01L 27/10808
See application file for complete search history.

(56) References Cited

U.S. PATENT DOCUMENTS

| | | | |
|---|---|---|---|
| 2005/0191856 A1* | 9/2005 | Torek | H01L 21/32134 438/689 |
| 2007/0063270 A1* | 3/2007 | Cho | H01L 29/78 257/330 |
| 2011/0147815 A1* | 6/2011 | Takeda | H01L 29/41725 257/288 |
| 2018/0190537 A1* | 7/2018 | Li | H01L 21/30604 |
| 2019/0081154 A1* | 3/2019 | Watanabe | H01L 21/32131 |
| 2020/0219883 A1* | 7/2020 | Nam | H01L 28/88 |

* cited by examiner

*Primary Examiner* — Galina G Yushina
(74) *Attorney, Agent, or Firm* — ScienBiziP, P.C.

(57) ABSTRACT

A method for fabricating a semiconductor device is provided. The method includes the actions of: providing a substrate comprising a preliminary pattern formed thereon; forming an opening through the preliminary pattern to expose a conductive portion in the substrate; forming a dielectric layer on a sidewall of the opening; performing a dry etching process to form a hole in the conductive portion; removing the dielectric layer; and depositing a conductive pattern over the sidewall of the opening and in the hole.

8 Claims, 23 Drawing Sheets

SEMICONDUCTOR DEVICE AND METHOD FOR FABRICATING THE SAME

CROSS REFERENCE TO RELATED APPLICATIONS

The present application claims the benefit of U.S. Provisional Application No. 62/781,659, filed on Dec. 19, 2018, the contents of which are incorporated herein by reference.

FIELD

The present disclosure relates to semiconductor fabrication and more specifically to a capacitor having a Y-shaped base and the fabricating method thereof.

BACKGROUND

As the height of capacitors increases and the size of the memory array shrinks, the aspect ratio of the capacitors rises, causing the stability of the capacitors to weaken. The collapse or twist of the capacitors may lead to poor yield rate.

SUMMARY

The following presents a summary of examples of the present disclosure in order to provide a basic understanding of at least some of its examples. This summary is not an extensive overview of the present disclosure. It is not intended to identify key or critical elements of the present disclosure or to delineate the scope of the present disclosure. The following summary merely presents some concepts of the present disclosure in a general form as a prelude to the more detailed description provided below.

In one example, a method for fabricating a semiconductor device is provided. The method includes the actions of: providing a substrate comprising a preliminary pattern formed thereon; forming an opening through the preliminary pattern to expose a conductive portion in the substrate; forming a spacer on a sidewall of the opening; performing a dry etching process to form a hole in the conductive portion; removing the spacer; and depositing a conductive pattern over the sidewall of the opening and in the hole.

In another example, a semiconductor device is provided. The semiconductor device includes a substrate, an etch stop pattern, and a conductive pattern. The substrate includes a hole. The etch stop pattern is disposed over the substrate. The conductive pattern includes upper portion extending upwardly from the substrate, and a lower portion filled in the hole. The upper portion is partially surrounded by the etch stop pattern.

In yet another example, a semiconductor device is provided. The semiconductor device includes a substrate, an etch stop pattern, and a conductive pattern. The substrate includes a conductive portion. The etch stop pattern is disposed over the substrate. The conductive pattern is electrically connected to the conductive portion of the substrate. The conductive pattern includes an upper portion extending upwardly from the substrate, and lower portion buried in the conductive portion. The upper portion is partially surrounded by the etch stop pattern.

The details of one or more examples are set forth in the accompanying drawings and description below.

BRIEF DESCRIPTION OF THE DRAWINGS

The accompanying drawings illustrate one or more implementations of the present disclosure and, together with the written description, explain the principles of the present disclosure. Wherever possible, the same reference numbers are used throughout the drawings referring to the same or like elements of an implementation.

DETAILED DESCRIPTION

Figure 1A:
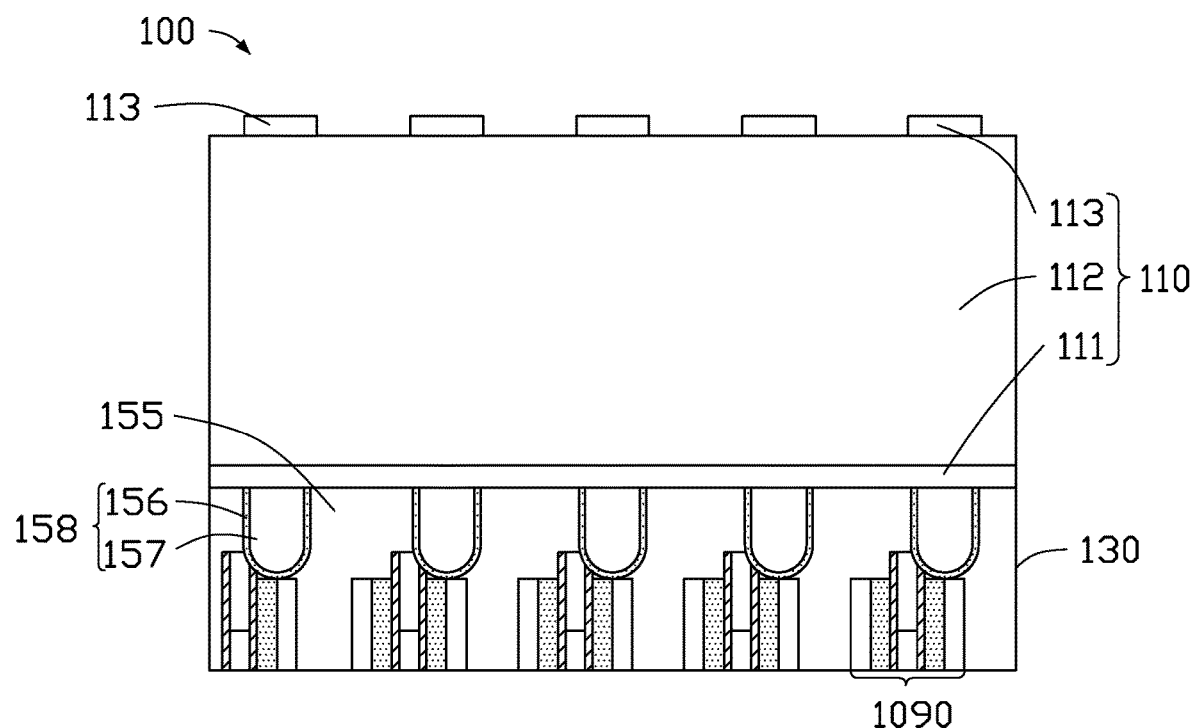
FIGS. 1A to 1H are cross-sectional views of a semiconductor device illustrating a method for fabricating a storage node in the semiconductor device in accordance with a first implementation of the present disclosure.

To facilitate an understanding of the principles and features of the various implementations of the present disclosure, various illustrative implementations are explained below. Although example implementations of the present disclosure are explained in detail, it is to be understood that other implementations are contemplated. Accordingly, it is not intended that the present disclosure is limited in its scope to the details of construction and arrangement of components set forth in the following description or illustrated in the drawings. The present disclosure is capable of other implementations and of being practiced or carried out in various ways.

FIGS. 1A to 1H are cross-sectional views illustrating a method for fabricating a storage node in a semiconductor device 100 in accordance with some implementations of the present disclosure. As shown in FIG. 1A, the semiconductor device 100 includes a substrate 130 and a preliminary pattern 110 formed on the substrate 130. The semiconductor device 100 may be a dynamic random access memory (DRAM) device. The substrate 130 includes a landing pad 155, a dielectric plug 158 having a first dielectric element 156, and a second dielectric element 157. The landing pad 155 may be formed of a metal material, such as tungsten, titanium, or tantalum. The first dielectric element 156 may be formed of a dielectric material, such as silicon nitride (SiN), by a chemical vapor deposition (CVD) process. The second dielectric element 157 may also be formed of a dielectric material, such as SiN, by an atomic layer deposition (ALD) process. In some implementations, the substrate 130 may be a silicon wafer. A circuit element 1090 including a gate structure, an impurity region, and/or a contact plug may be provided in the substrate 130.

The preliminary pattern 110 includes an etch stop layer 111, a sacrificial layer 112 formed on the etch stop layer 111, and mask patterns 113 formed over the sacrificial layer 112. For example, the preliminary pattern 110 may be formed by sequentially stacking the etch stop layer 111, the sacrificial layer 112, and the mask patterns 113 using a deposition technique, such as ALD process, a plasma assisted atomic layer deposition (PAALD), a CVD process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, or the like. Preferably, the preliminary pattern 110 has a thickness falling in the range of 1 to 1.3 microns (μm).

In some implementations, the etch stop layer 111 may include a material selected from SiN, silicon boron nitride (SiBN), silicon carbon nitride (SiCN), silicon carbide (SiC), silicon oxynitride (SiON), silicon oxycarbide (SiOC), or the like. The sacrificial layer 112 may be formed of a silicon oxide-based material, such as silicon oxide (SiOx), plasma enhanced oxide (PEOX), boro silicate glass (BSG), phospho silicate glass (PSG), boro phospho silicate glass (BPSG), tetraethyl orthosilicate (TEOS), boro tetraethyl orthosilicate (BTEOS), phosphorous tetraethyl orthosilicate (PTEOS), or boro phospho tetraethyl orthosilicate (BPTEOS). The mask patterns 113 may be made of a combination of SiN and polysilicon. Alternatively, the mask patterns 113 may be made of a metal material.

Figure 1B:
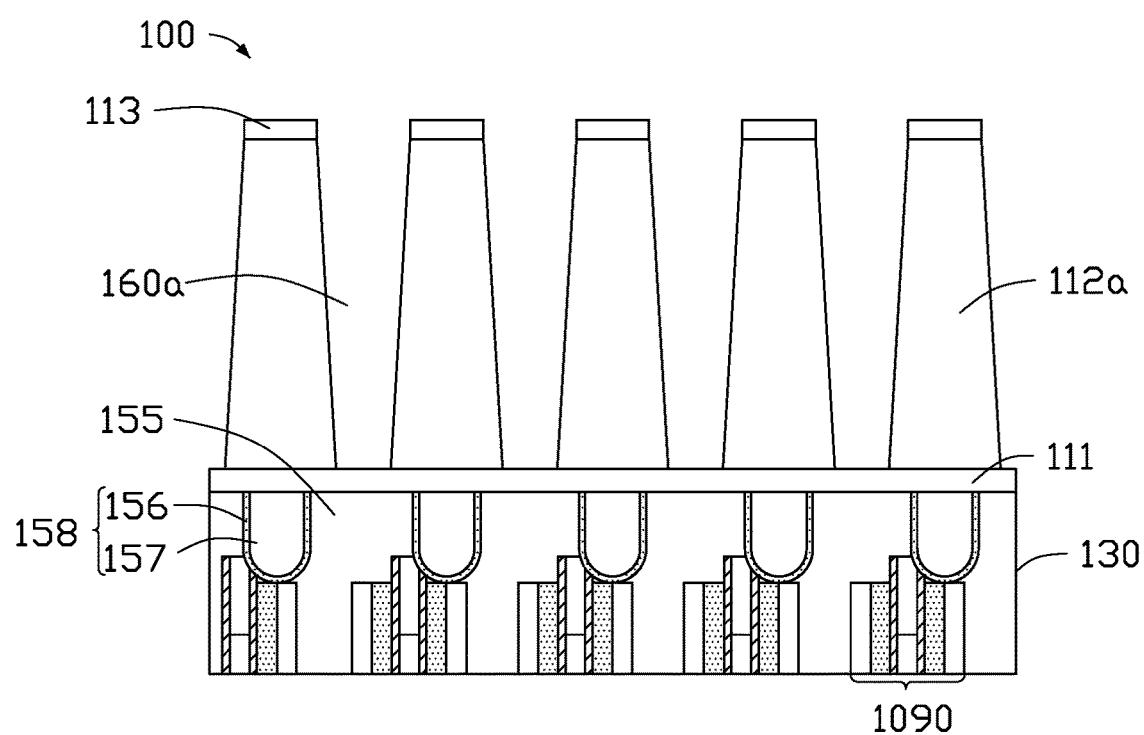

As shown in FIG. 1B, an etching process is performed on the mask patterns 113 to form a first opening 160a in the sacrificial layer 112 to expose the etch stop layer 111. For example, a dry etching process such as a plasma etching process, an inductively coupled plasma (ICP) process, a transformer coupled plasma (TCP) process or a reactive ion etching (RIE) process may be used. The resulting first opening 160a may be a tapered trench. The upper width of the first opening 160a is wider than the lower width thereof. Accordingly, a plurality of tapered pillars 112a are formed on the etch stop layer 111. Each of the tapered pillars 112a protrudes upward and is in alignment with the dielectric plug 158.

Figure 1C:
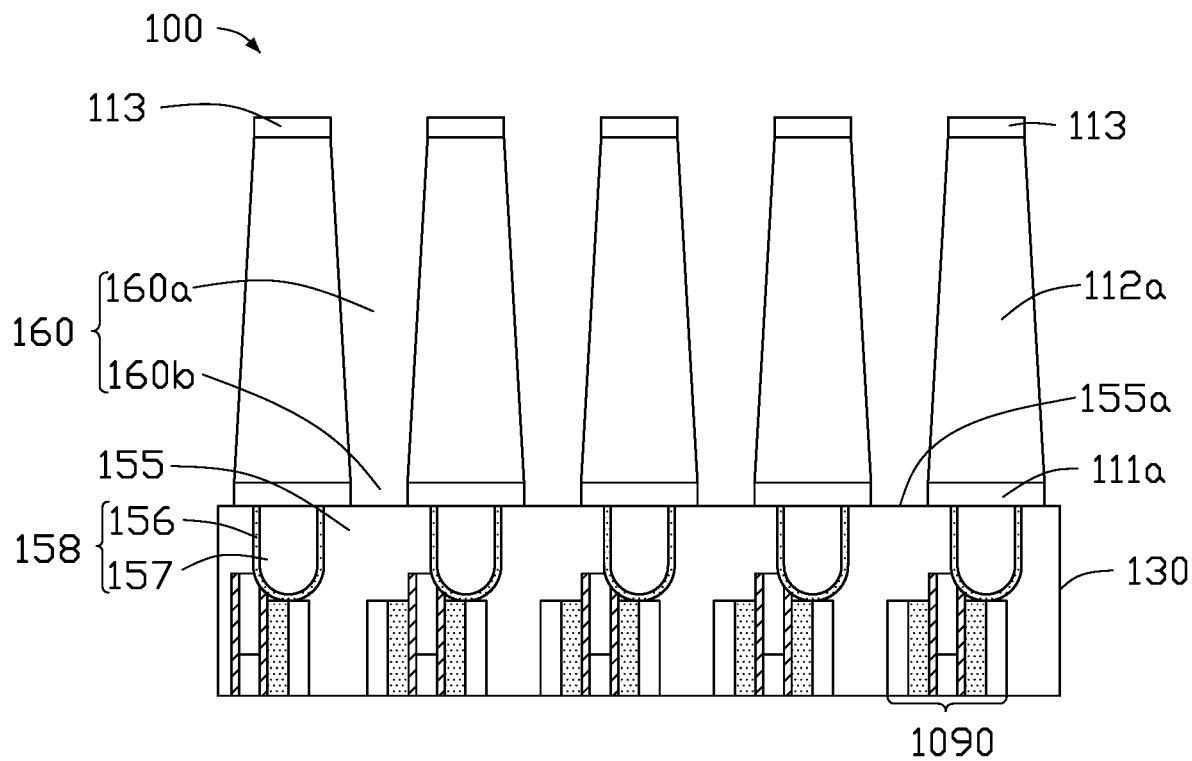

As shown in FIG. 1C, an etching process is performed to form a second opening 160b in the etch stop layer 111 to expose the substrate 130. For example, a dry etching process such as a plasma etching process, an ICP process, a TCP process or a RIE process may be used. The resulting second opening 160b may be a recess. A portion of the landing pad 155 may be exposed by the second opening 160b; i.e., a top surface 155a of the portion of the landing pad 155 is defined by the bottom of the second opening 160b. Accordingly, a plurality of etch stop patterns 111a are formed below the tapered pillars 112a. In some implementations, an opening 160 including the first opening 160a and the second opening 160b may be formed by a single etching process.

Figure 1D:
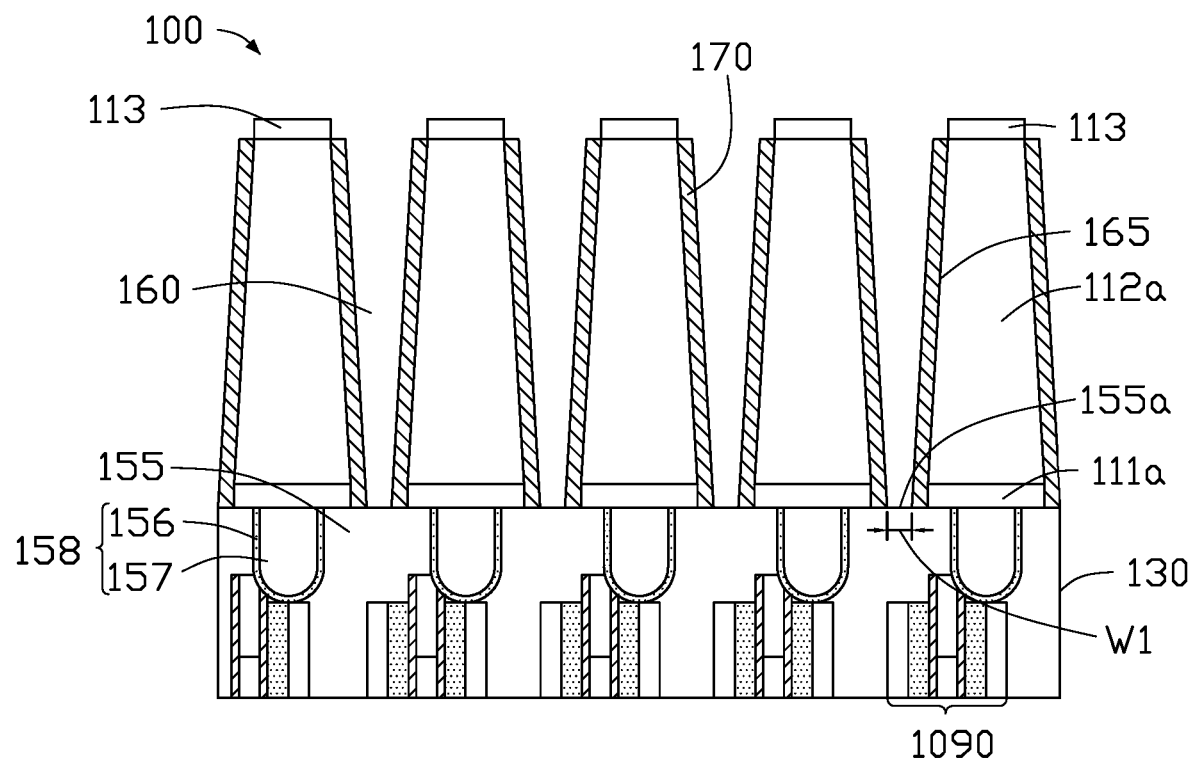

As shown in FIG. 1D, a dielectric layer 170 is formed on a sidewall 165 of the opening 160 by a deposition process such as a CVD process or ALD process. The dielectric layer 170 may be a spacer covering the etch stop patterns 111a, the tapered pillars 112a, and a portion of the top surface 155a of the landing pad 155 to serve as a hard mask for the subsequent etching process. The width W1 of the non-covered area on the top surface 155a falls in the range of 30 to 40 nanometers (nm). Preferably, the dielectric layer 170 has a uniform thickness of 70 angstroms (Å).

Figure 1E:
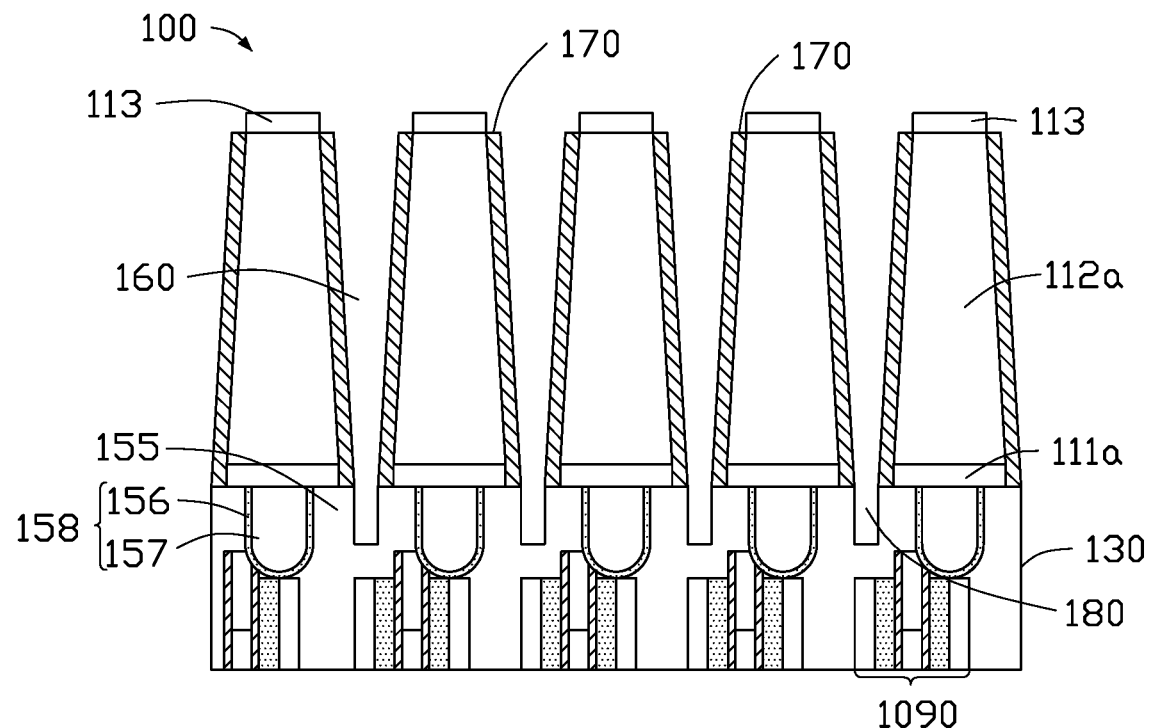

As shown in FIG. 1E, an etching process is performed to form a hole 180 in the landing pad 155. For example, a dry etching process may be performed. The hole 180 penetrates the landing pad 155 by a predetermined depth. For example, the depth of the hole 180 is 0.2 microns and the width of the hole 180 falls in the range of 30 to 40 nanometers.

Figure 1F:
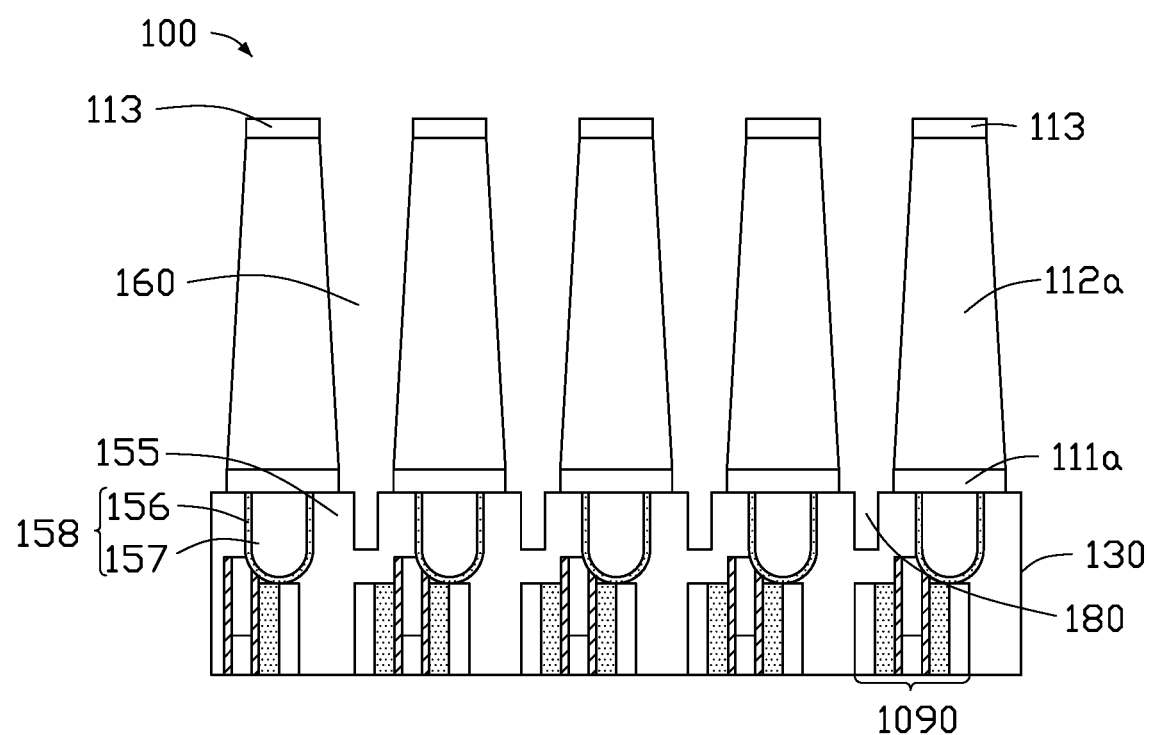

As shown in FIG. 1F, subsequent to the formation of the hole 180, the dielectric layer 170 may be removed by an etching process such as a plasma etching process, an ICP process, a TCP process or a RIE process.

Figure 1G:
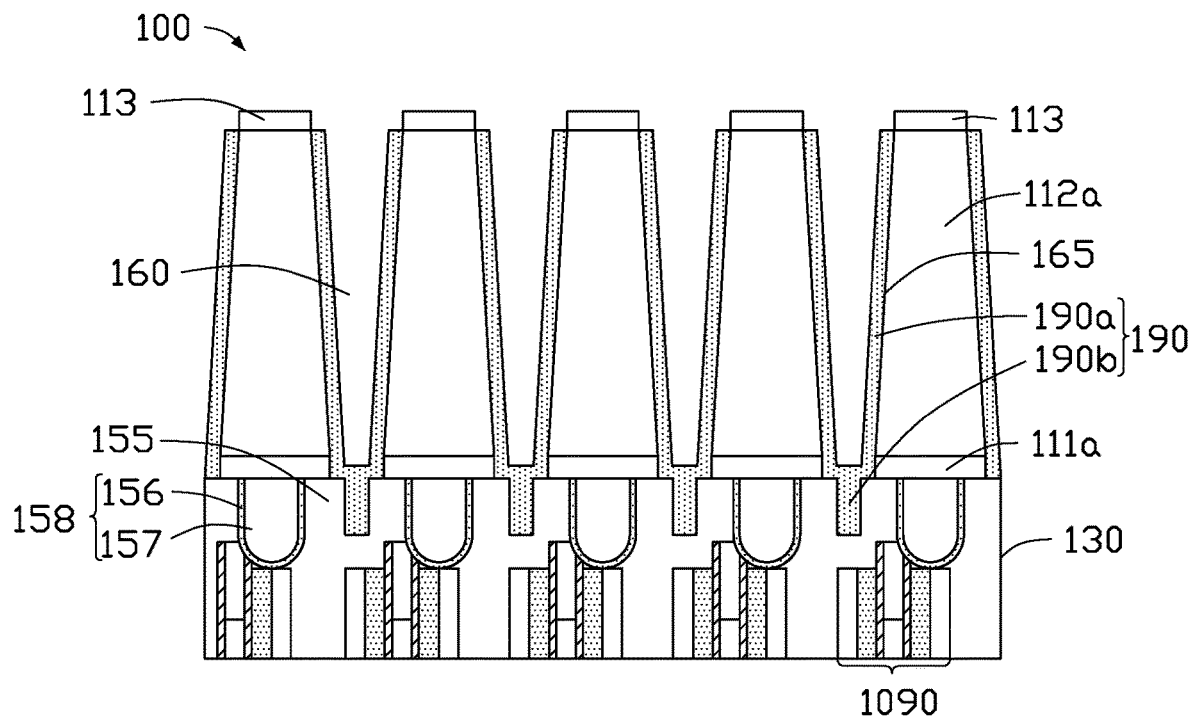

As shown in FIG. 1G, a conductive pattern 190 is formed over the substrate 130 by a deposition process such as a CVD process or ALD process. The conductive pattern 190 may be a lower electrode or a storage node of a capacitor of a DRAM device. The conductive pattern 190 may be formed of a material such as titanium nitride, titanium, tungsten, or the like. The conductive pattern 190 includes an upper portion 190a and a lower portion 190b. The lower portion 190b fills the hole 180. The upper portion 190a covers the sidewall 165 of the opening 160 and the top surface 155a of the landing pad 155. Preferably, the upper portion 190a is partially surrounded by the etch stop patterns 111a. In some implementations, the conductive pattern 190 may be formed by a single deposition process or a plurality of deposition processes.

Figure 1H:
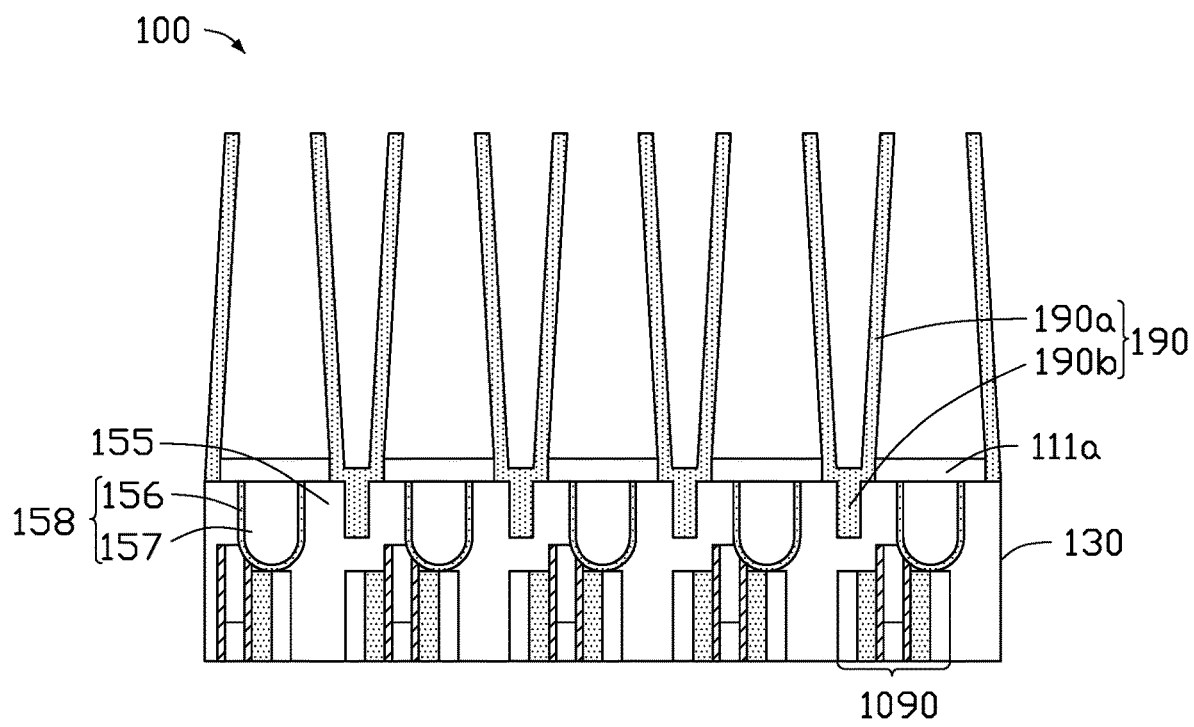

As shown in FIG. 1H, the mask patterns 113 and the tapered pillars 112a are removed. For example, the mask patterns 113 are removed by a dry etching process, and the tapered pillars 112a are removed by a wet etching process. In some implementations, the conductive pattern 190 is electrically connected to the landing pad 155. The upper portion 190a extends upwardly from the substrate 130 and has a vertical length falling in the range of 1 to 1.3 microns. The lower portion 190b is buried in the landing pad 155 and has a vertical length (or depth) of 0.2 microns. Accordingly, a ratio of the vertical length of the upper portion 190a to the vertical length of the lower portion 190b falls in a range of 4 to 7. Preferably, the upper portion 190a has a truncated hollow circular cone structure.

According to the example implementations described with reference to FIGS. 1A to 1H, the capacitor has an improved structural stability. The lower portion 190b of the conductive pattern 190 has a Y-shaped structure serving as a fixture base to enhance the structural stability of the conductive pattern 190, therefore preventing the capacitor from deformation. Furthermore, the lower portion 190b increases the contact area between the conductive pattern 190 and the landing pad 155, therefore increasing the capacitance of the capacitor.

FIGS. 2A to 2H are cross-sectional views illustrating a method for fabricating a storage node having a horizontal support layer in a semiconductor device 200 in accordance with some implementations of the present disclosure. In FIGS. 2A to 2H, detailed descriptions regarding processes and/or materials that are substantially the same as or similar to those described above with reference to FIGS. 1A to 1H are omitted herein, and like reference numerals are used to designate like elements.

Figure 2A:
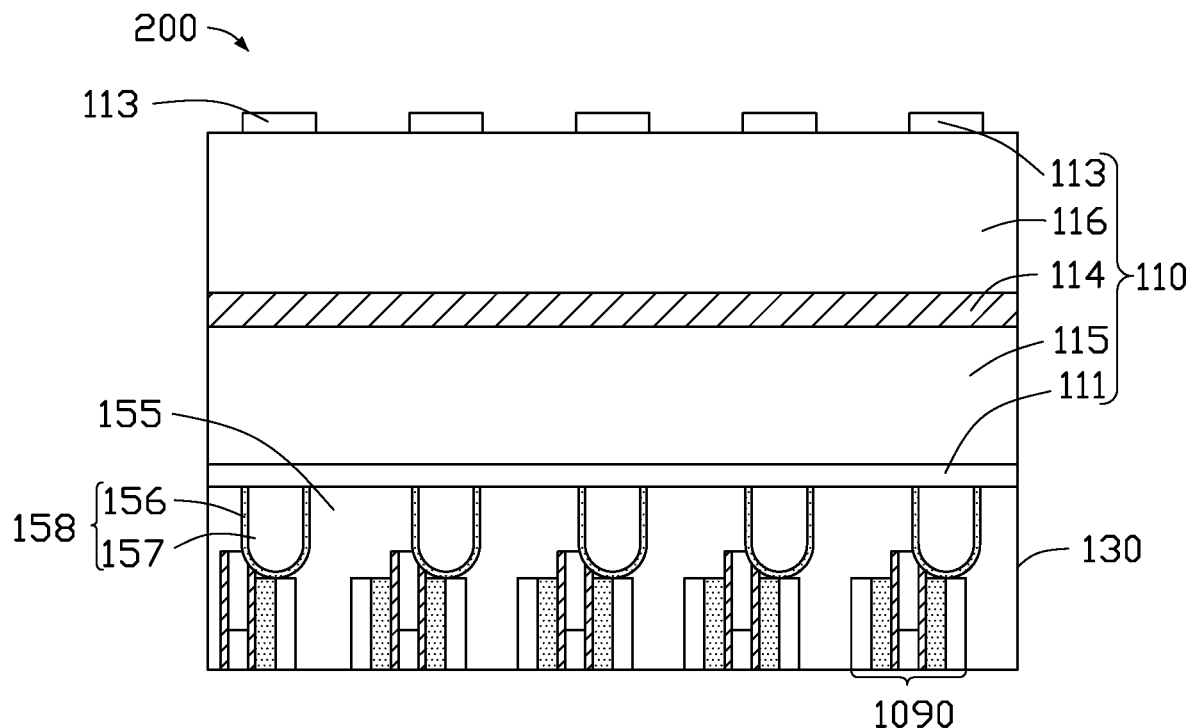
FIGS. 2A to 2H are cross-sectional views of a semiconductor device illustrating a method for fabricating a storage node with a horizontal support layer in the semiconductor device in accordance with a second implementation of the present disclosure.

As shown in FIG. 2A, the semiconductor device 200 includes a substrate 130, a preliminary pattern 110 formed on the substrate 130. The semiconductor device 200 may be a DRAM device. The substrate 130 includes a landing pad 155, a dielectric plug 158 having a first dielectric element 156, and a second dielectric element 157. The landing pad 155 may be formed of a metal material. The first dielectric element 156 may be formed of a dielectric material. The second dielectric element 157 may also be formed of a dielectric material. In some implementations, the substrate 130 may be a silicon wafer.

The preliminary pattern 110 includes an etch stop layer 111, a first sacrificial layer 115 formed on the etch stop layer 111, a support layer 114 formed on the first sacrificial layer 115, a second sacrificial layer 115 formed on the support layer 114, and mask patterns 113 formed over the second sacrificial layer 116. For example, the preliminary pattern 110 may be formed by sequentially stacking the etch stop layer 111, the first sacrificial layer 115, the support layer 114, the second sacrificial layer 116, and the mask patterns 113 using a deposition technique. The first sacrificial layer 115, the support layer 114, the second sacrificial layer 116 may be a laminate structure. Preferably, the preliminary pattern 110 has a thickness falling in the range of 1 to 1.3 microns.

In some implementations, the etch stop layer 111 may be made of SiN or SiBN. The first and second sacrificial layers 115, 116 may be formed of a silicon oxide-based material. The support layer 114 may be formed of SiN or SiCN. The mask patterns 113 may be made of a combination of SiN and polysilicon. The mask patterns 113 may also be made of a metal material.

Figure 2B:
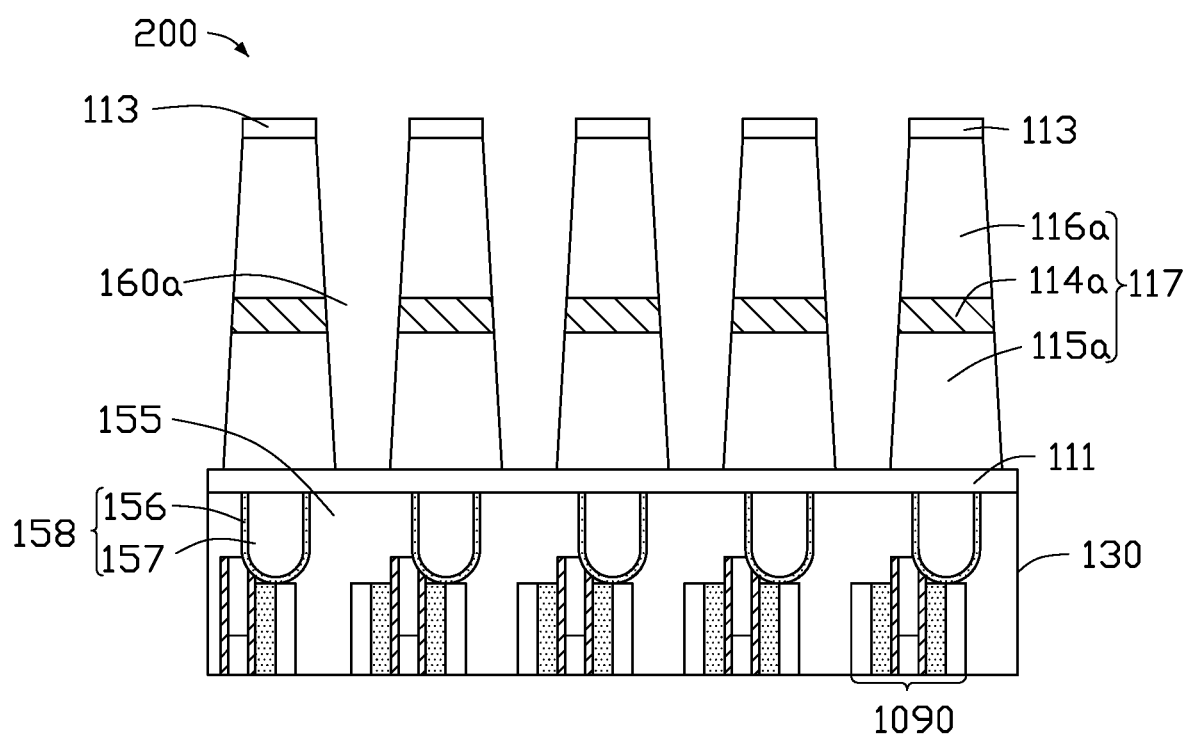
Figure 2C:
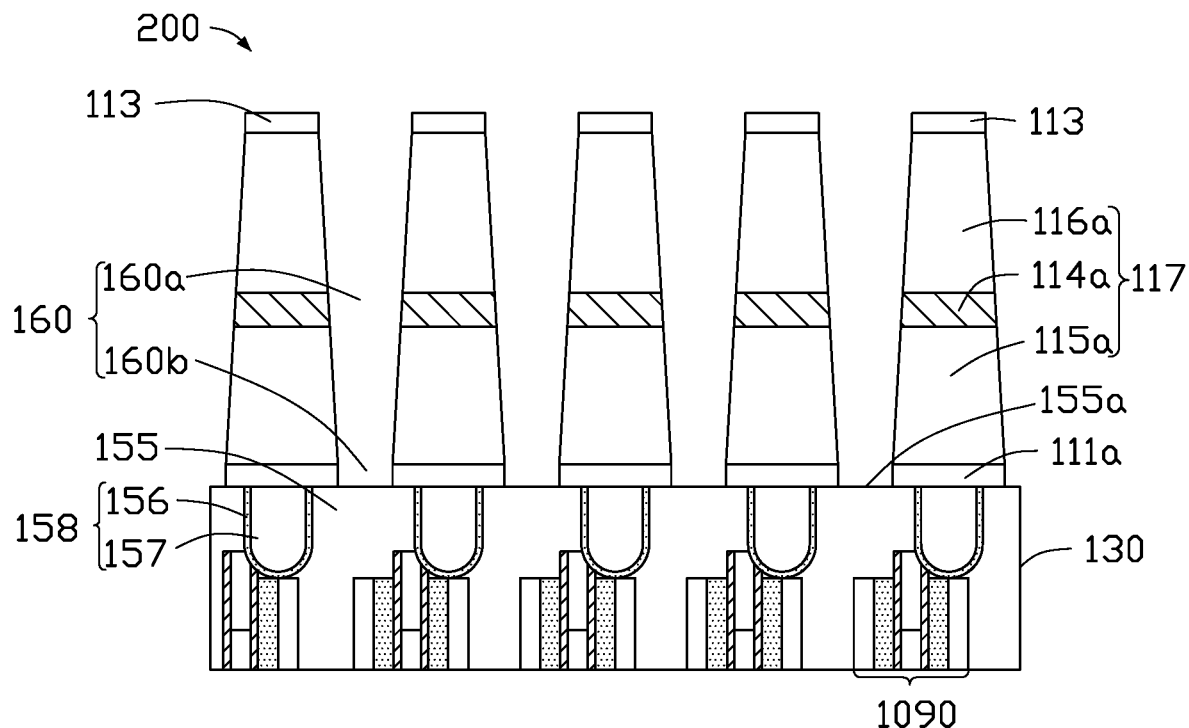
Figure 2D:
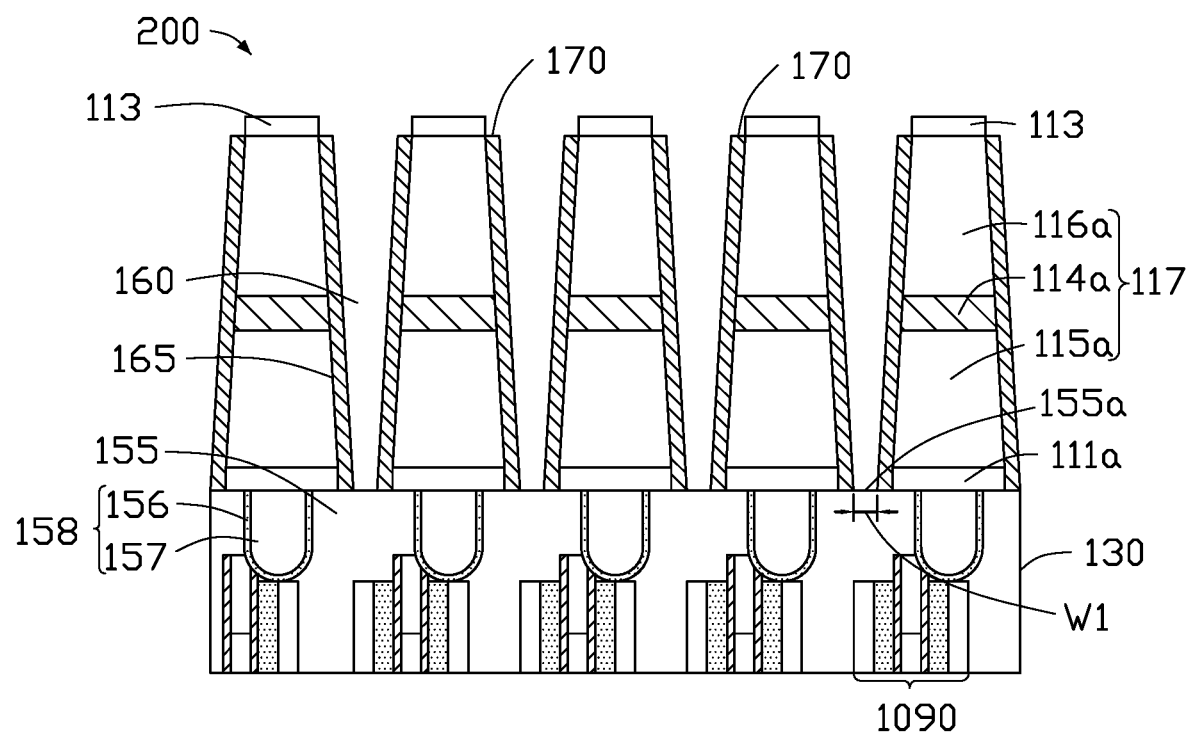
Figure 2E:
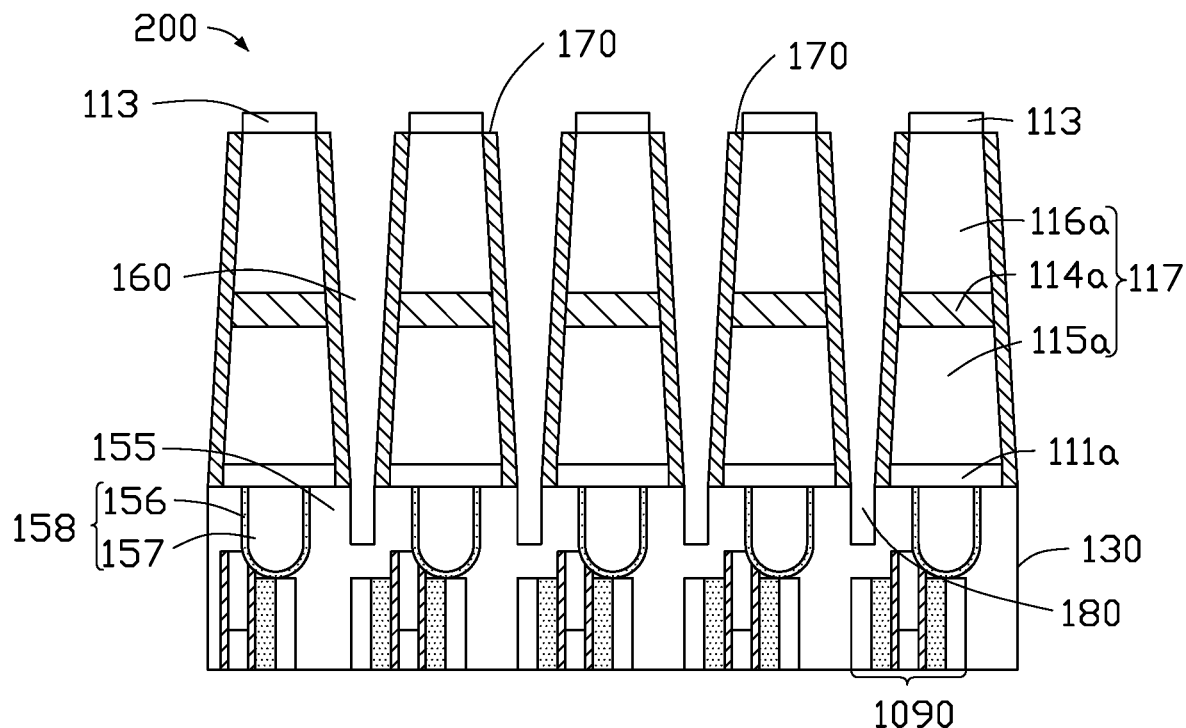

As shown in FIG. 2B, an etching process is performed on the mask patterns 113 to form a first opening 160a in the sacrificial layer 112 and expose the etch stop layer 111. For example, a dry etching process may be used. The resulting first opening 160a may be a tapered trench. The upper width of the first opening 160a is wider than the lower width thereof. Accordingly, a plurality of tapered pillars 117 are formed on the etch stop layer 111. The tapered pillars 117 includes a portion 115a of the first sacrificial layer 115, a portion 114a of the support layer 114, a portion 116a of the second sacrificial layer 116. Each of the tapered pillars 117 protrudes upward and is in alignment with the dielectric plug 158.

Figure 2F:
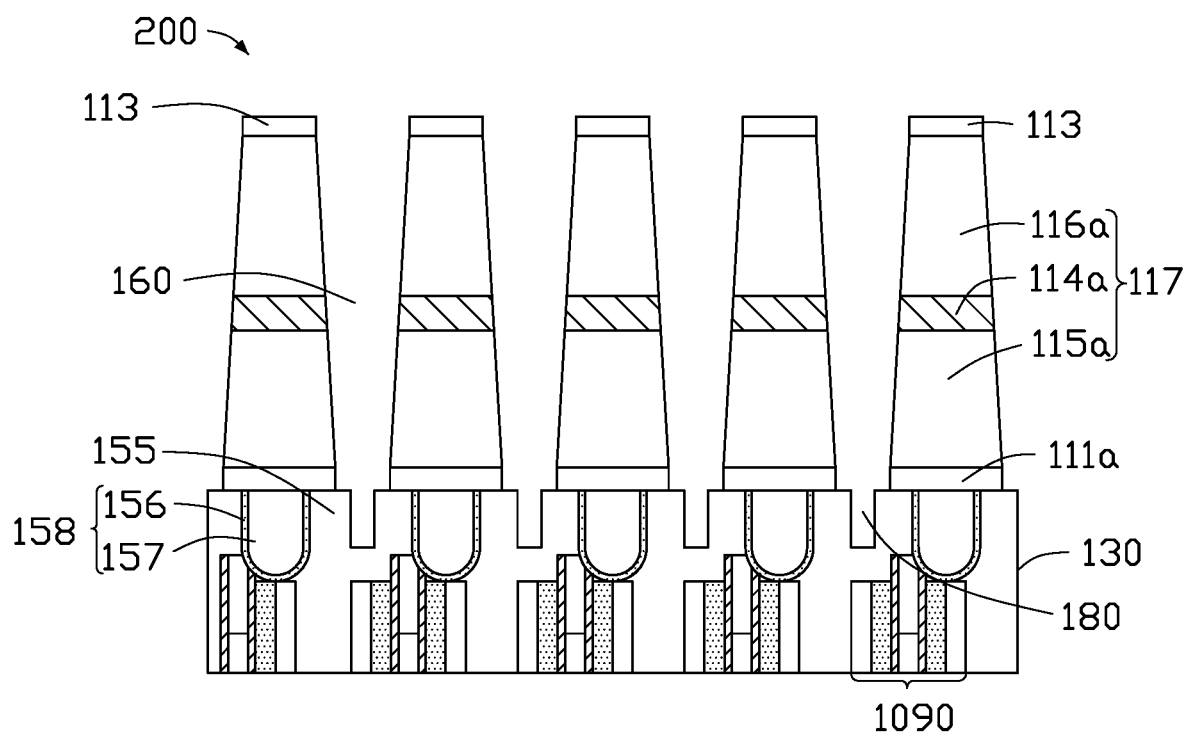

Referring to FIGS. 2C to 2F, processes substantially the same as or similar to those illustrated with reference to FIGS. 1C to 1F may be used to form the hole 180 as shown in FIG. 2F. The method for forming the hole 180 includes the action of: performing a dry etching process to form the second opening 160b (e.g., a recess) penetrating the etch stop layer 111 and partially expose the landing pad 155 of the substrate 130. The bottom of the second opening 160b defines an exposed surface 155a of the landing pad 155. The method further includes the action of: forming the dielectric layer 170 on the sidewall 165 of the opening 160. The dielectric layer 170 conformally covers the tapered pillars 117, the etch stop patterns 111a, and a portion of the top surface 155a of the landing pad 155. That is to say, the dielectric layer 170 extends from the landing pad 155 to the top of the tapered pillars 117. In some examples, the action of forming the dielectric layer 170 includes performing a deposition process to form a deposited layer, and an etch-back process to remove a portion of the deposited layer. The method further includes the action of: performing an etching process to form the hole 180 in the landing pad 155. The mask patterns 113 and the dielectric layer 170 serve as a mask while forming the hole 180. Preferably, the hole 180 is in the middle between two adjacent dielectric plugs 158, and isolated from the two dielectric plugs 158 and the circuit element 1090. The method further includes the action of: performing an etching process to remove the dielectric layer 170.

Figure 2G:
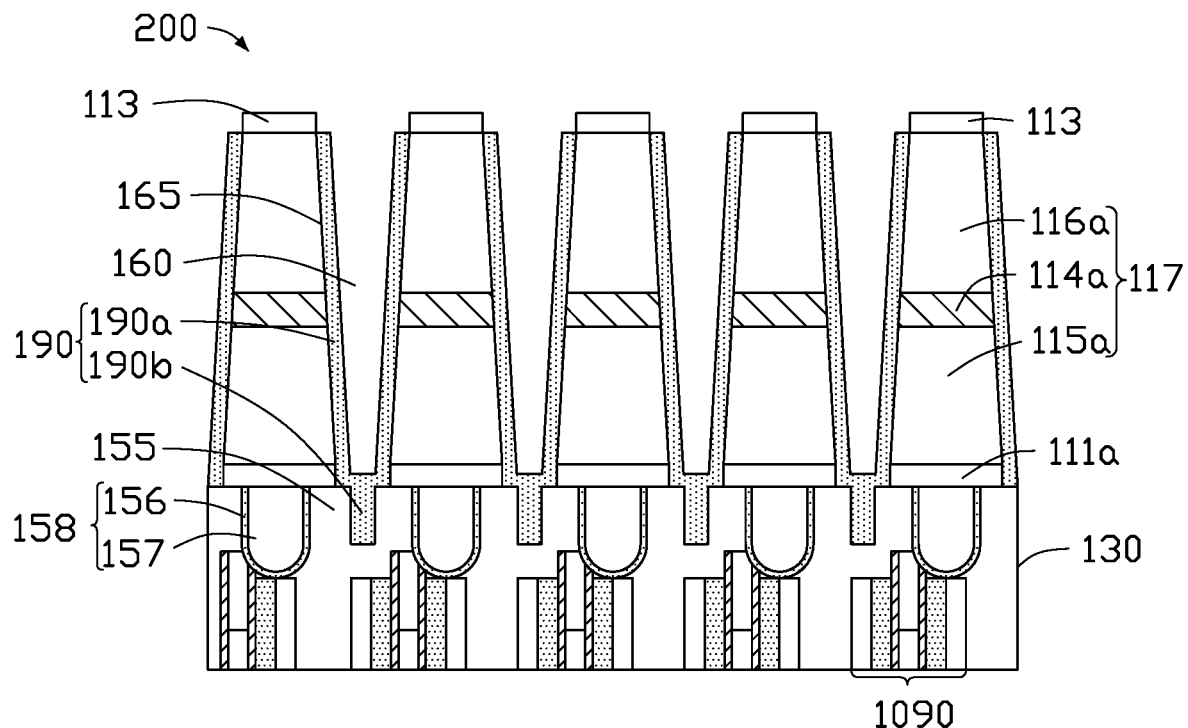

As shown in FIG. 2G, a conductive pattern 190 is formed over the substrate 130 by a deposition process. The conductive pattern 190 may be formed of a metal material to serve as an electrode or a storage node of a capacitor of the DRAM device. The upper portion 190a of the conductive pattern 190 conformally covers the tapered pillars 117, the etch stop patterns 111a, and a portion of the top surface 155a of the landing pad 155. That is to say, the upper portion 190a extends from the landing pad 155 to the top of the tapered pillars 117. The lower portion 190b of the conductive pattern 190 fills the hole 180.

Figure 2H:
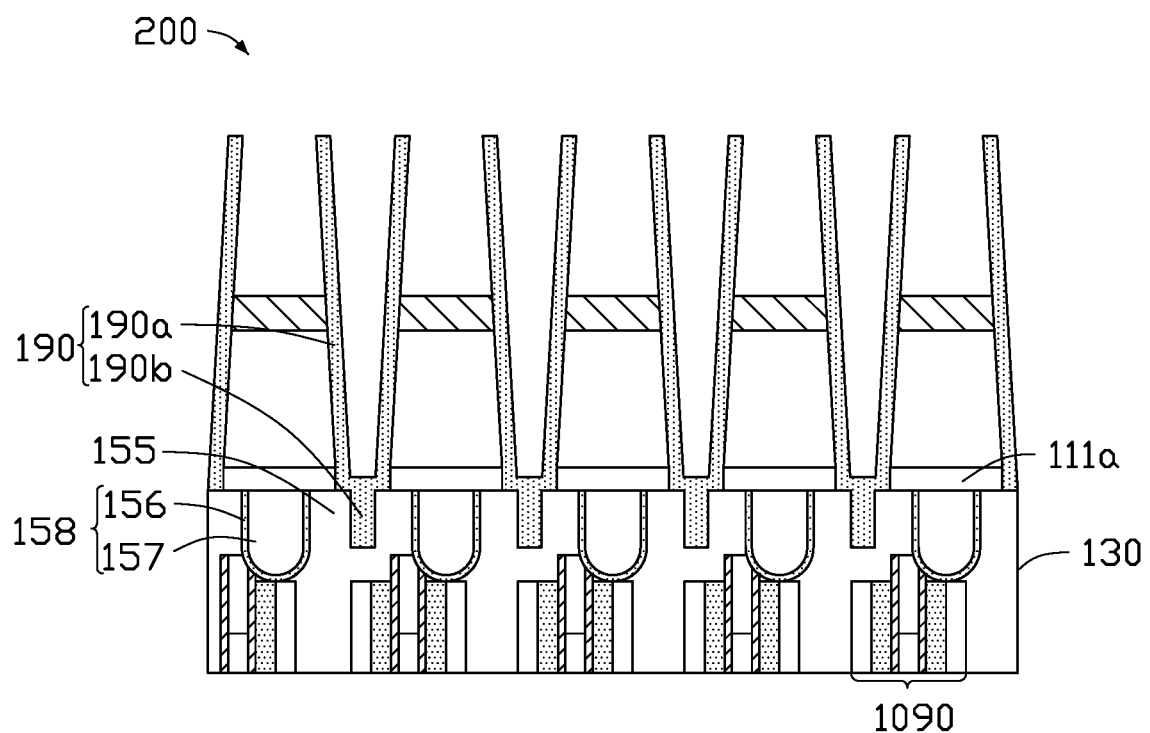

As shown in FIG. 2H, the mask patterns 113, the portion 116a of the first sacrificial layer 115, and the portion 115a of the second sacrificial layer 116 are removed. For removing the portion 116a, the mask patterns 113 is removed by a dry etching process to expose surface of the portion 116a under the mask patterns 113. Subsequently, a wet etching process is used to remove the portion 116a. For removing the portion 115a, some the portions 114a is removed by a dry etching process to expose surface of the portion 115a under the removed portions 114a (not shown). Subsequently, a wet etching process is used to remove the portion 115a.

In some implementations, the conductive pattern 190 has a Y-shaped structure. Since both the upper portion 190a and the lower portion 190b contact with the landing pad 155, the conductive pattern 190 is electrically connected to the landing pad 155. Preferably, the upper portion 190a is partially surrounded by the etch stop patterns 111a at the bottom of the upper portion 190a and partially surrounded by the portion 114a of the support layer 114 at the middle of the upper portion 190a. For example, the support layer 114 is connected to an outer sidewall of the upper portion 190a as shown in FIG. 2H.

Figure 3A:
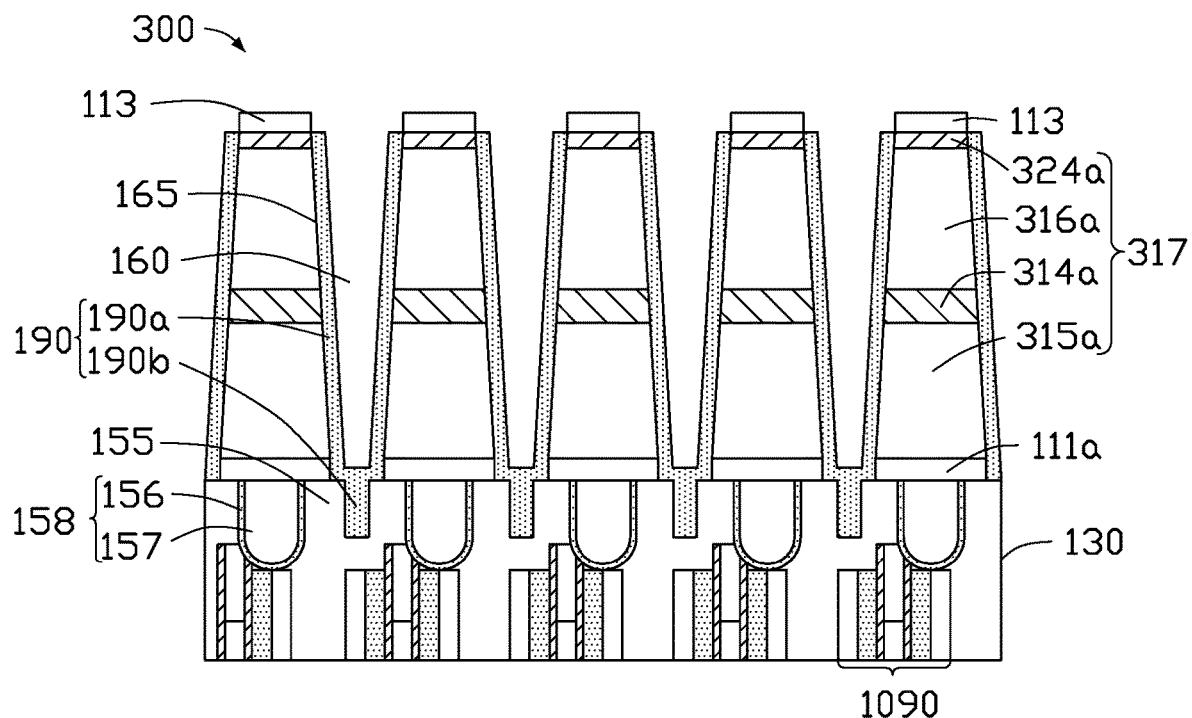
FIGS. 3A to 3B are cross-sectional views of a semiconductor device illustrating a method for fabricating a storage node with a dual horizontal support layers in the semiconductor device in accordance with a third implementation of the present disclosure.
Figure 3B:
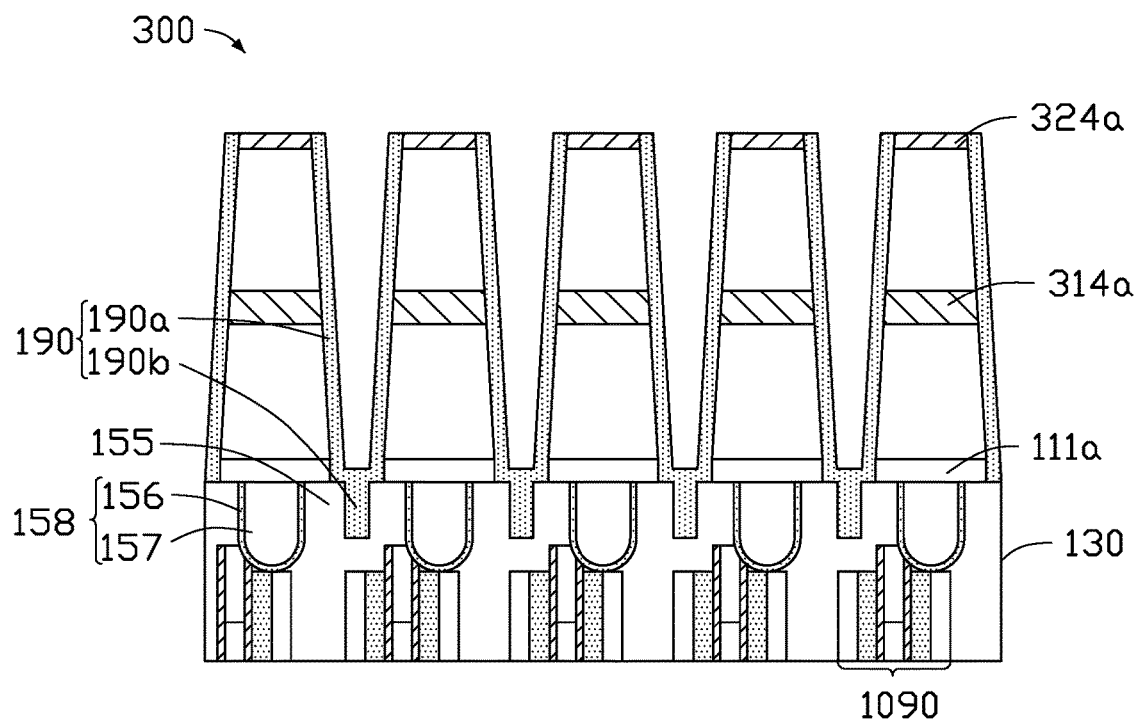

FIGS. 3A to 3B are cross-sectional views illustrating a method for fabricating a storage node having a dual horizontal support layers in a semiconductor device 300 in accordance with some implementations of the present disclosure. In FIGS. 3A to 3B, detailed descriptions regarding materials that are substantially the same as or similar to those described above with reference to FIGS. 2A to 2H are omitted herein, and like reference numerals are used to designate like elements.

Referring to FIGS. 3A to 3B, processes substantially the same as or similar to those with reference to FIGS. 2A to 2H may be used to form the conductive pattern 190 as shown in FIG. 3B. The method to form the conductive pattern 190 includes the actions of: providing a substrate 130 including a preliminary pattern formed thereon; forming an opening 160 through the preliminary pattern to expose the substrate 130; forming a dielectric layer 170 on a sidewall 165 of the opening 160; performing a dry etching process to form a hole 180 in the substrate; removing the dielectric layer 170; and depositing a conductive pattern 190 over the sidewall 165 and in the hole 180. The preliminary pattern includes an etch stop layer contacting the substrate 130, a laminate structure formed on the etch stop layer 111, and a plurality of mask patterns 113 formed over the laminate structure. The laminate structure includes tapered pillars 317 including two sacrificial layers 315a, 316a and two support layers 314a, 324a. The method further includes removing the sacrificial layers 315a, 316a by processes previously described in FIG. 2H.

According to the example implementations described with reference to FIGS. 2A to 2H and 3A to 3B, the capacitor has an improved structural stability. The lower portion 190b of the conductive pattern 190 has a Y-shaped structure serving as a fixture base. The support layer 114a, 314a, 324a provides horizontal support between the conductive patterns 190. The enhancement of the structural stability of the conductive pattern 190 prevents the capacitor from deformation. Furthermore, the lower portion 190b increases the contact area between the conductive pattern 190 and the landing pad 155, therefore increasing the capacitance of the capacitor.

Figure 4A:
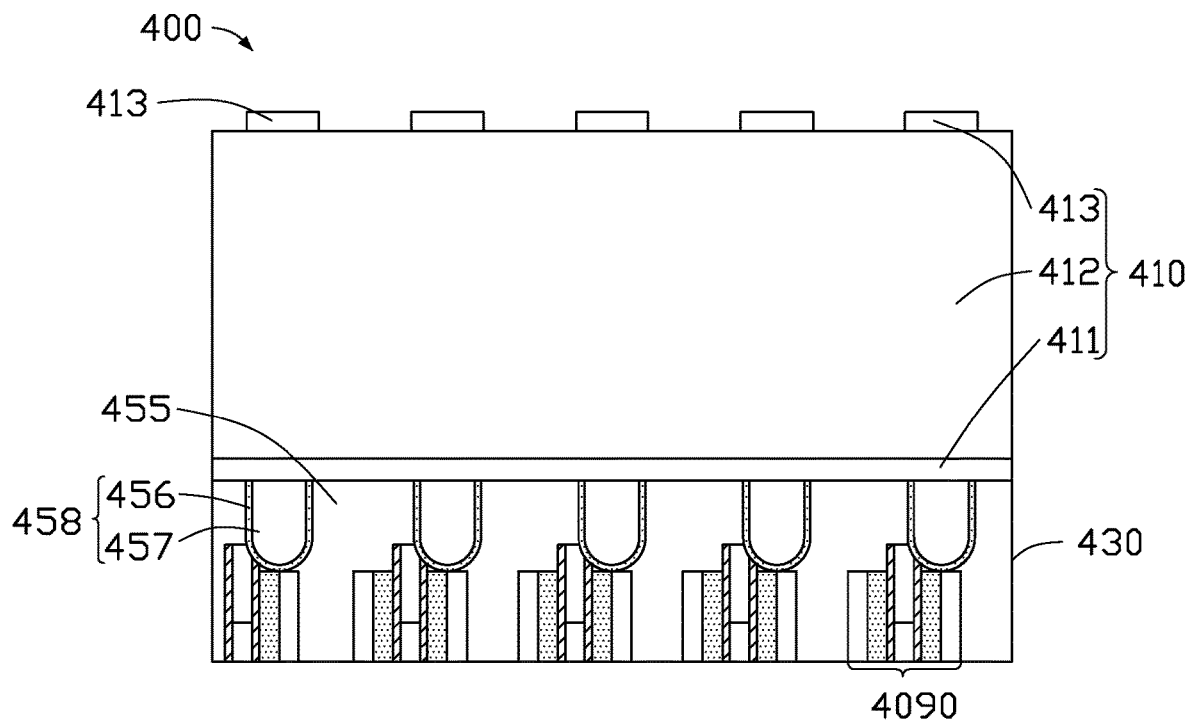
FIGS. 4A to 4F are cross-sectional views of a semiconductor device illustrating a method for fabricating a storage node in the semiconductor device in accordance with a fourth implementation of the present disclosure.

FIGS. 4A to 4F are cross-sectional views illustrating a method for fabricating a storage node in a semiconductor device 400 in accordance with some implementations of the present disclosure. As shown in FIG. 4A, the semiconductor device 400 includes a substrate 430, a preliminary pattern 410 formed on the substrate 430. The semiconductor device 400 may be a dynamic random access memory (DRAM) device. The substrate 430 includes a landing pad 455 and a dielectric plug 458 having a first dielectric element 456, and a second dielectric element 457. The landing pad 455 may be formed of a metal material, such as tungsten, titanium, or tantalum. The first dielectric element 456 may be formed of a dielectric material such as SiN by a CVD process. The second dielectric element 457 may be formed of a dielectric material such as SiN by an ALD process. In some implementations, the substrate 430 may be a silicon wafer. A circuit element 4090 including a gate structure, an impurity region, and/or a contact plug may be provided in the substrate 430.

Figure 4B:
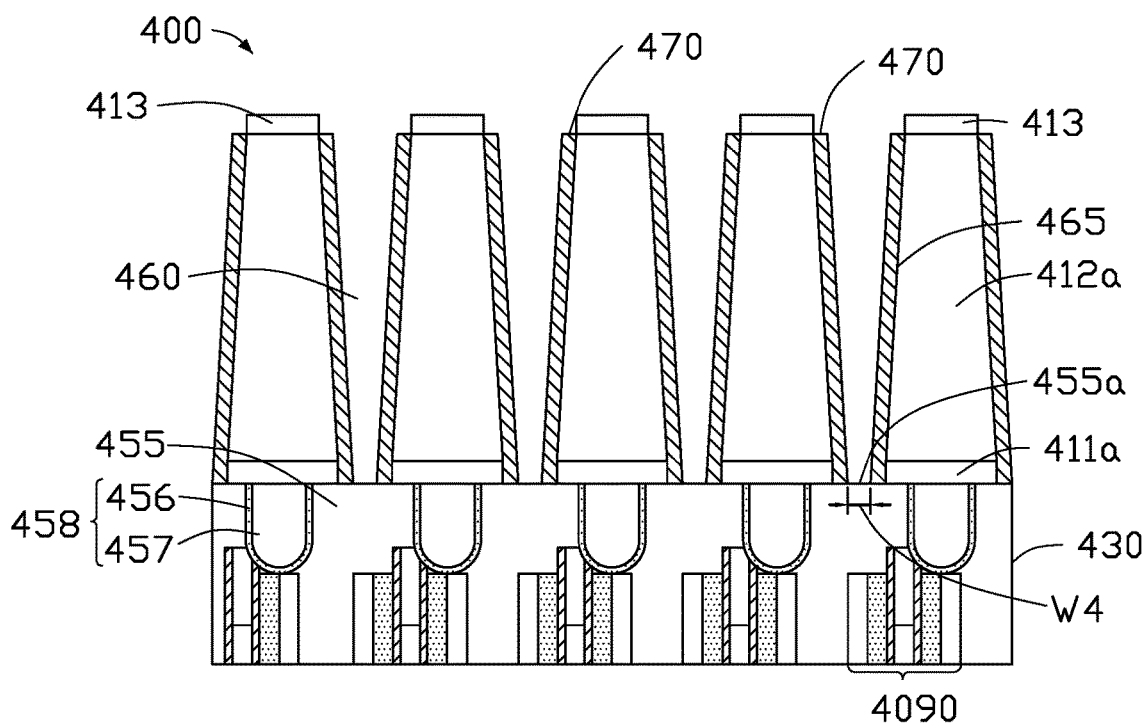

Referring to FIGS. 4A to 4B, processes substantially the same as or similar to those illustrated with reference to FIGS. 1A to 1D may be performed to form the dielectric layer 470 as shown in FIG. 4B. A width W4 of the non-covered area on the top surface 455a is shown in FIG. 4B.

Figure 4C:
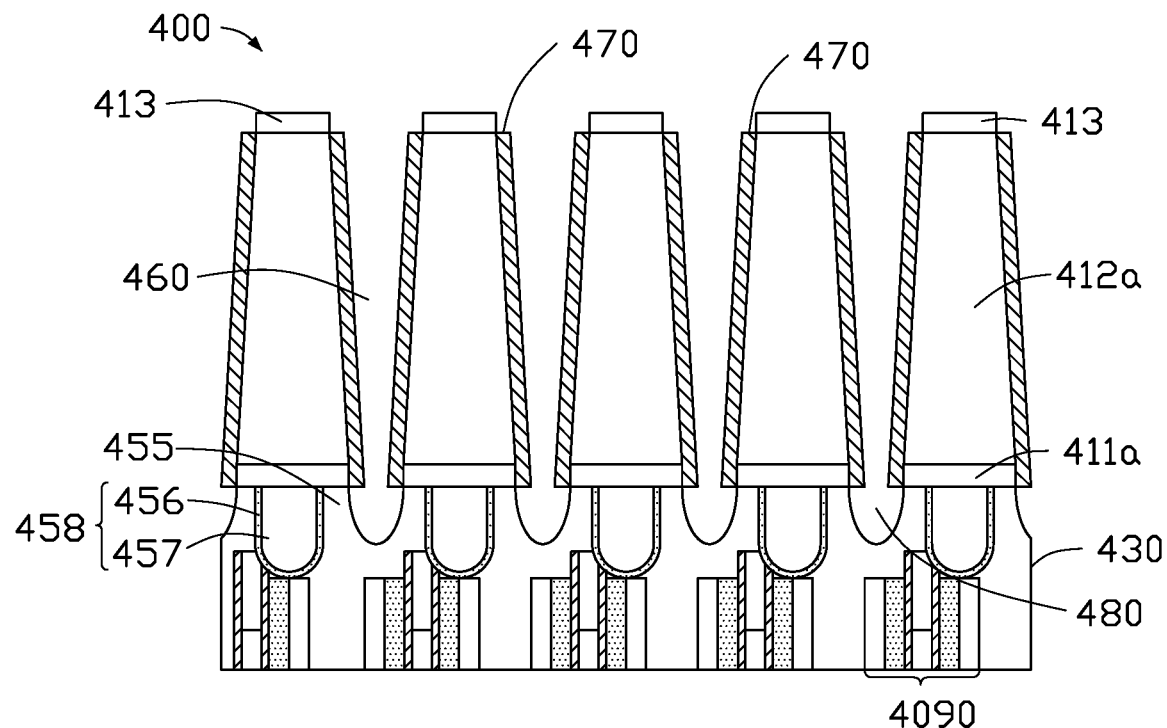

As shown in FIG. 4C, an etching process is performed to form a hole 480 in the landing pad 455. For example, a wet etching process may be performed. The hole 480 penetrates the landing pad 455 by a predetermined depth. For example, the depth of the hole 480 may be 0.2 microns and the length of the widest portion of the hole 480 may fall in the range of 50 to 60 nanometers.

Figure 4D:
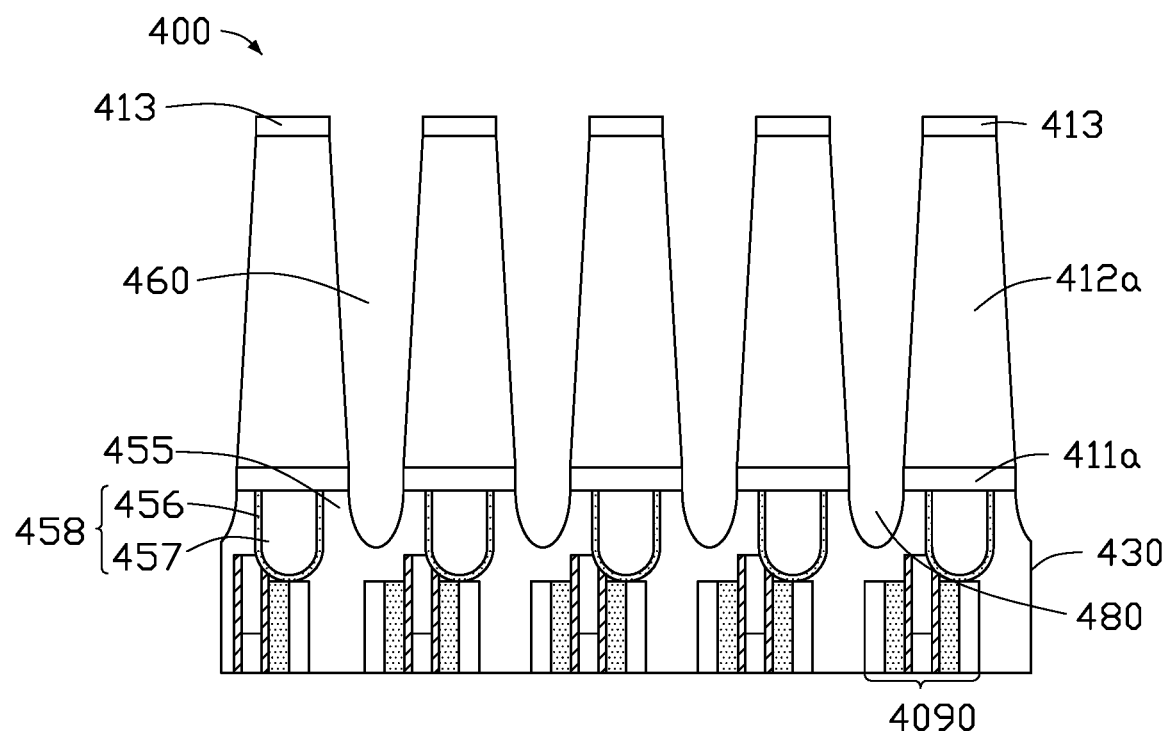

As shown in FIG. 4D, subsequent to the formation of the hole 480, the dielectric layer 470 may be removed by an etching process such as a plasma etching process, an ICP process, a TCP process or a RIE process.

Figure 4E:
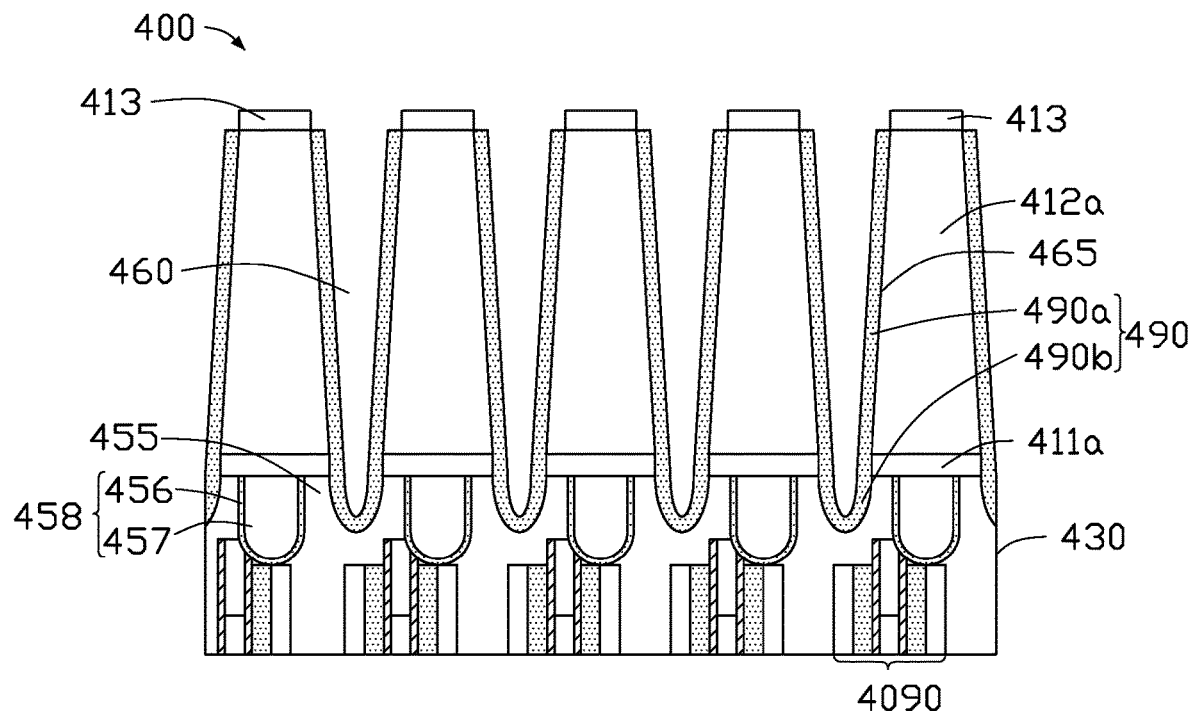

As shown in FIG. 4E, a conductive pattern 490 is formed over the substrate 430 by a deposition process, such as a CVD process or ALD process. The conductive pattern 490 may be a lower electrode or a storage node of a capacitor of the DRAM device. The conductive pattern 490 may be formed of a material, such as titanium nitride, titanium, tungsten, or the like. The conductive pattern 490 includes an upper portion 490a and a lower portion 490b. The lower portion 490b covers a surface of the hole 480. The upper portion 490a covers the sidewall 465 of the opening 460 and the top surface 455a of the landing pad 455. Preferably, the upper portion 490a is partially surrounded by the etch stop patterns 411a. In some implementations, the conductive pattern 490 may be formed by a single deposition process or a plurality of deposition processes.

Figure 4F:
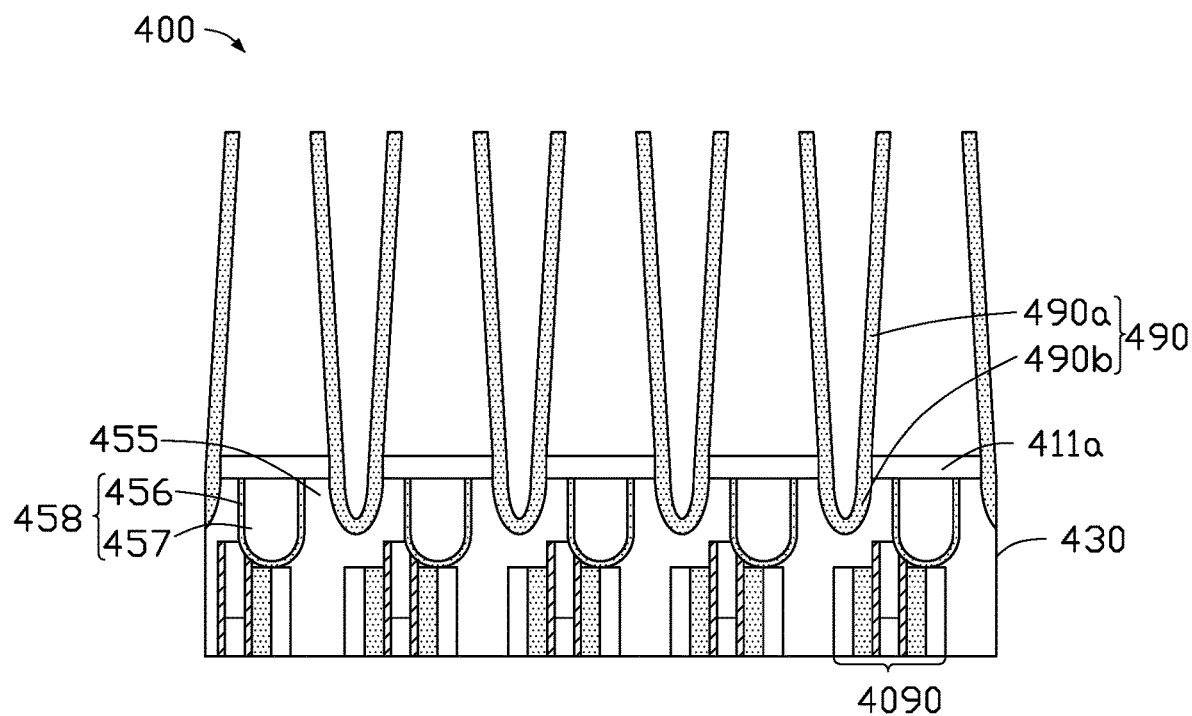

As shown in FIG. 4F, the mask patterns 413 and the tapered pillars 412a are removed. For example, the mask patterns 413 are removed by a dry etching process, and the tapered pillars 412a are removed by a wet etching process. In some implementations, the conductive pattern 490 is electrically connected to the landing pad 455. The upper portion 490a extends upwardly from the substrate 430 and may have a vertical length falling in the range of 1 to 1.3 microns. The lower portion 490b may have a vertical length of 0.2 microns. Accordingly, a ratio of the vertical length of the upper portion 490a to the vertical length of the lower portion 190b may fall in a range of 4 to 7. Preferably, the upper portion 490a has a truncated hollow circular cone structure (not shown).

According to the example implementations described with reference to FIGS. 4A to 4F, the capacitor has an improved structural stability. The lower portion 490b of the conductive pattern 490 has a hollow U-shaped structure serving as a fixture base to enhance the structural stability of the conductive pattern 490, therefore preventing the capacitor from deformation. Furthermore, the lower portion 490b increases the contact area between the conductive pattern 490 and the landing pad 455, therefore increasing the capacitance of the capacitor.

FIGS. 5A-5F are cross-sectional views illustrating a method for fabricating a storage node with a horizontal support layer in the semiconductor device 500 in accordance with some implementations of the present disclosure. In FIGS. 5A to 5H, detailed descriptions regarding processes and/or materials that are substantially the same as or similar to those described above with reference to FIGS. 4A to 4F are omitted herein, and like reference numerals are used to designate like elements.

Figure 5A:
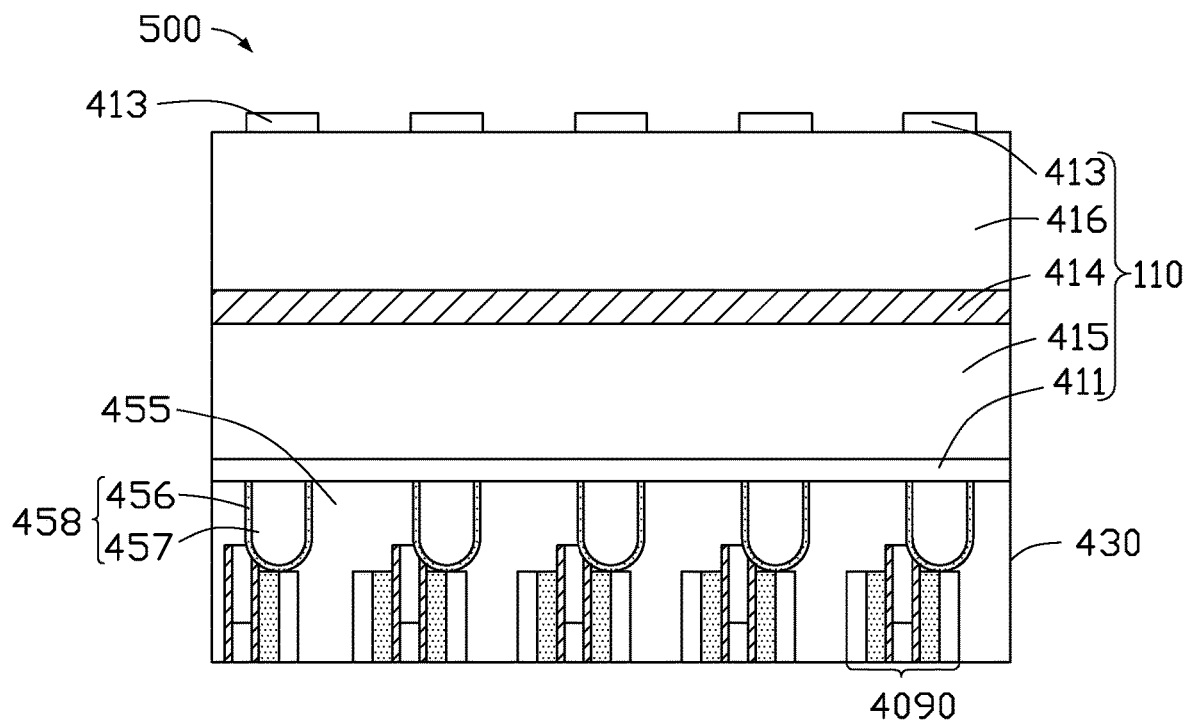
FIGS. 5A to 5F are cross-sectional views of a semiconductor device illustrating a method for fabricating a storage node with a horizontal support layer in the semiconductor device in accordance with a fifth implementation of the present disclosure.
Figure 5B:
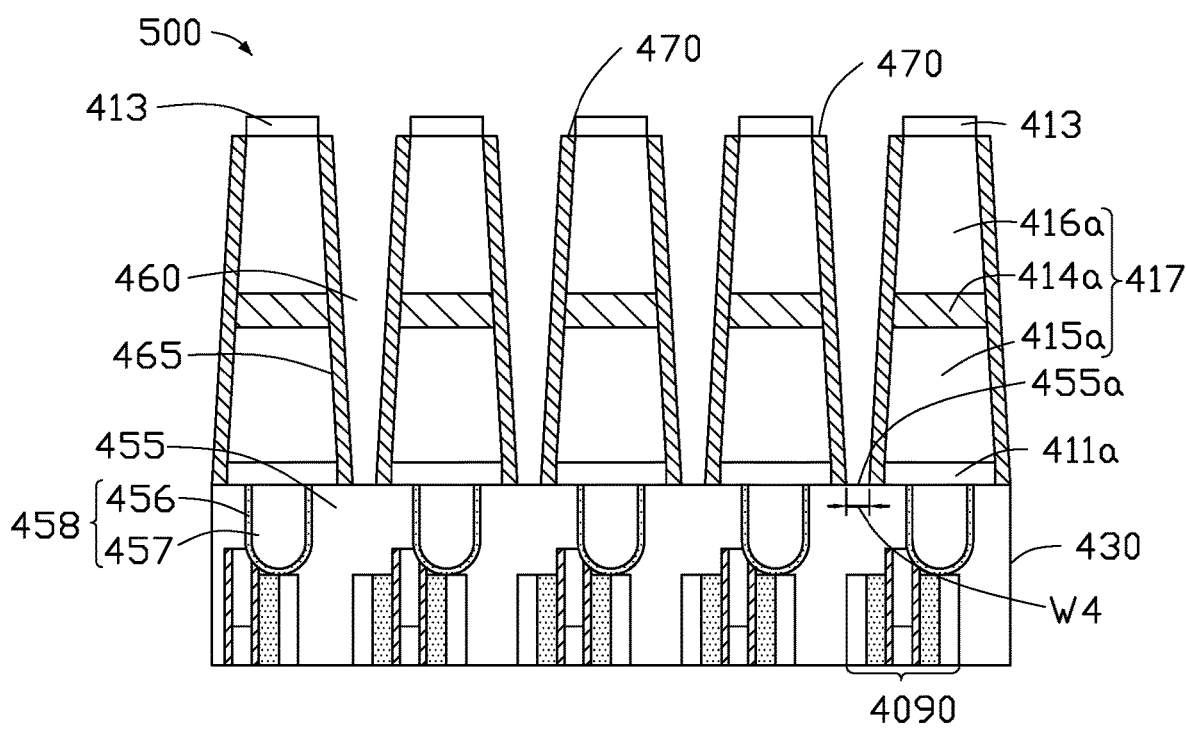

Referring to FIGS. 5A to 5B, processes substantially the same as or similar to those illustrated with reference to FIGS. 2A to 2D may be performed to form the dielectric layer 470 as shown in FIG. 5B.

Figure 5C:
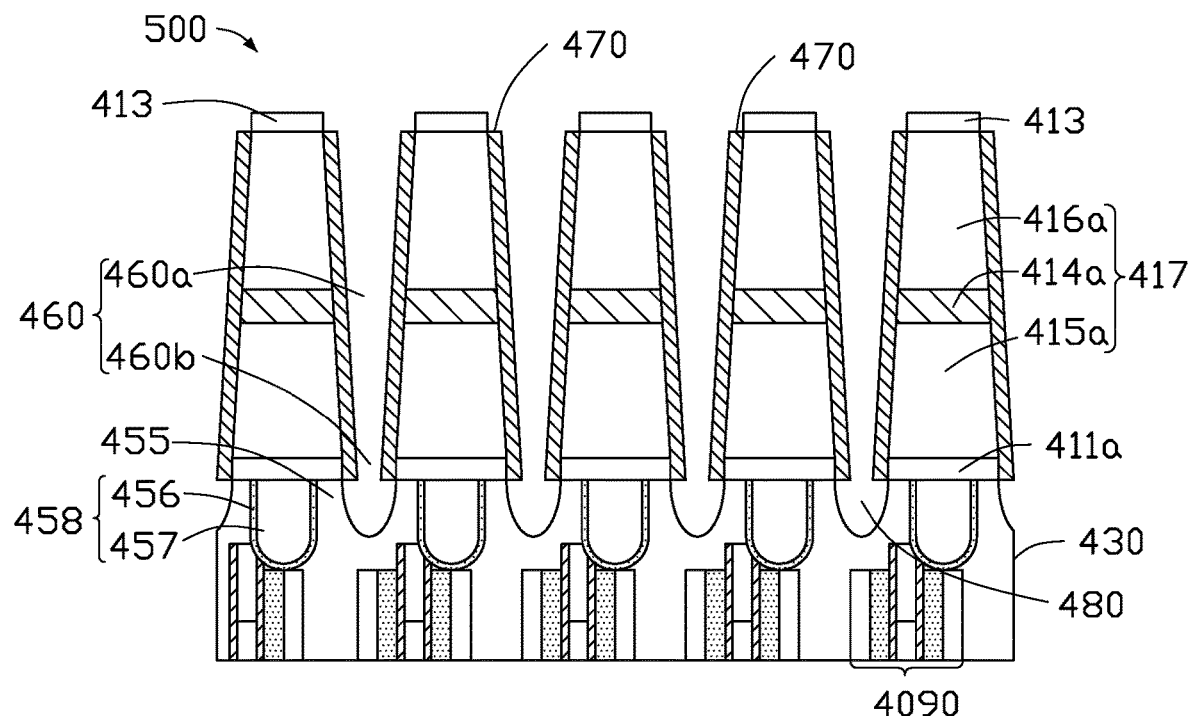
Figure 5D:
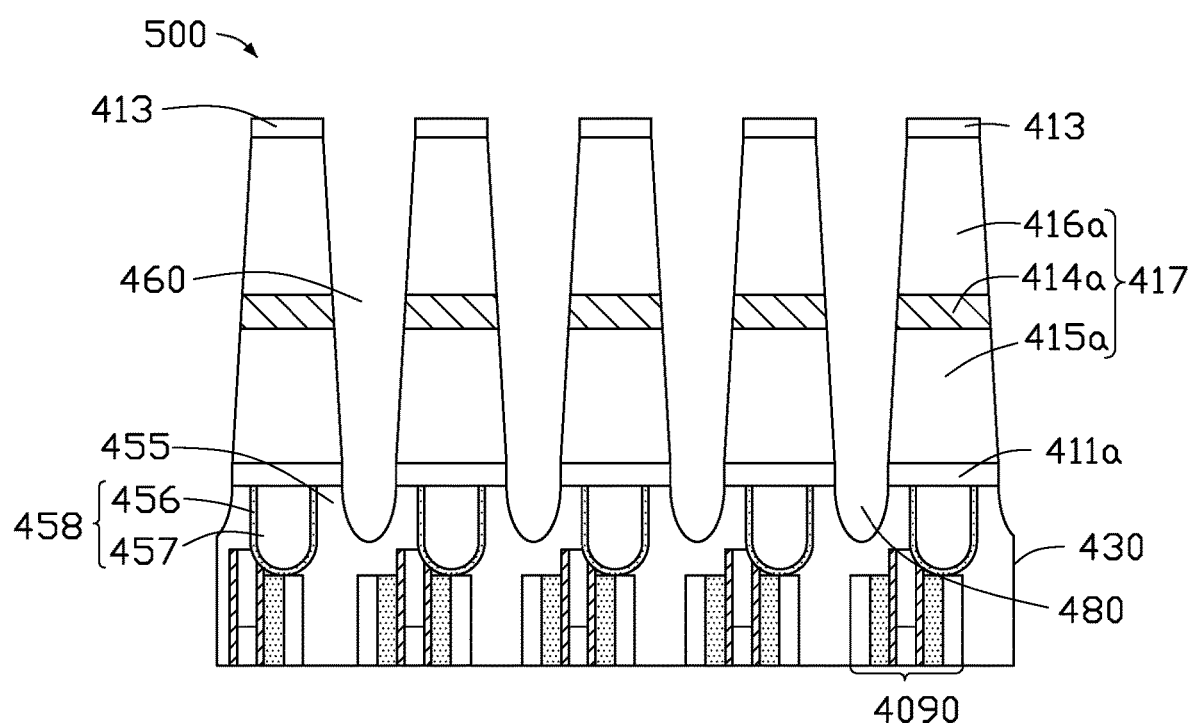

Referring to FIGS. 5C to 5D, processes substantially the same as or similar to those illustrated with reference to FIGS. 4C to 4D may be used to form the hole 480 as shown in FIG. 5D. The method for forming the hole 480 may include the action of: performing an etching process to form the hole 480 in the landing pad 455. The mask patterns 413 and the dielectric layer 470 may serve as a mask while forming the hole 480. Preferably, the hole 480 is in the middle between two adjacent dielectric plugs 458, and isolated from the two dielectric plugs 458 and the circuit element 4090. The method may further include the action of: performing an etching process to remove the dielectric layer 470.

Figure 5E:
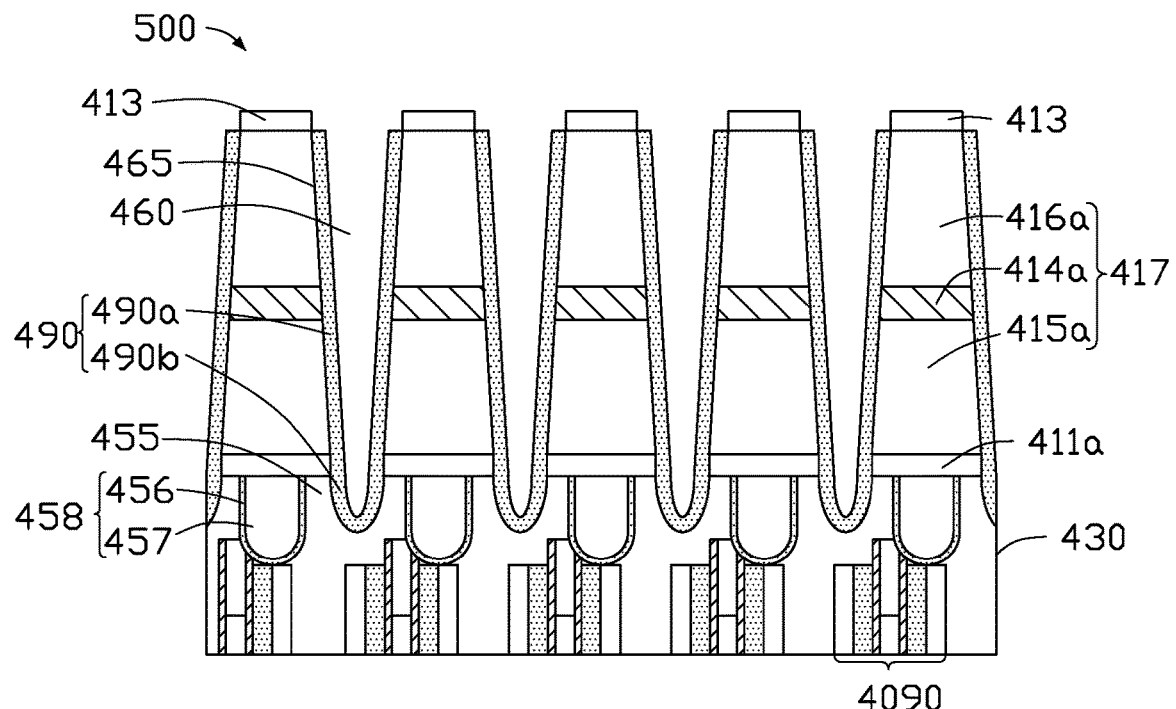

As shown in FIG. 5E, a conductive pattern 490 is formed over the substrate 430 by a deposition process. The conductive pattern 490 may be formed of a metal material to serve as an electrode or a storage node of a capacitor of the DRAM device. The upper portion 490a of the conductive pattern 490 may conformally cover the tapered pillars 417, the etch stop patterns 411a, and a portion of the top surface 455a of the landing pad 455. That is to say, the upper portion 190a extends from the landing pad 455 to the top of the tapered pillars 417. The lower portion 190b of the conductive pattern 490 may cover a surface of the hole 480.

Figure 5F:
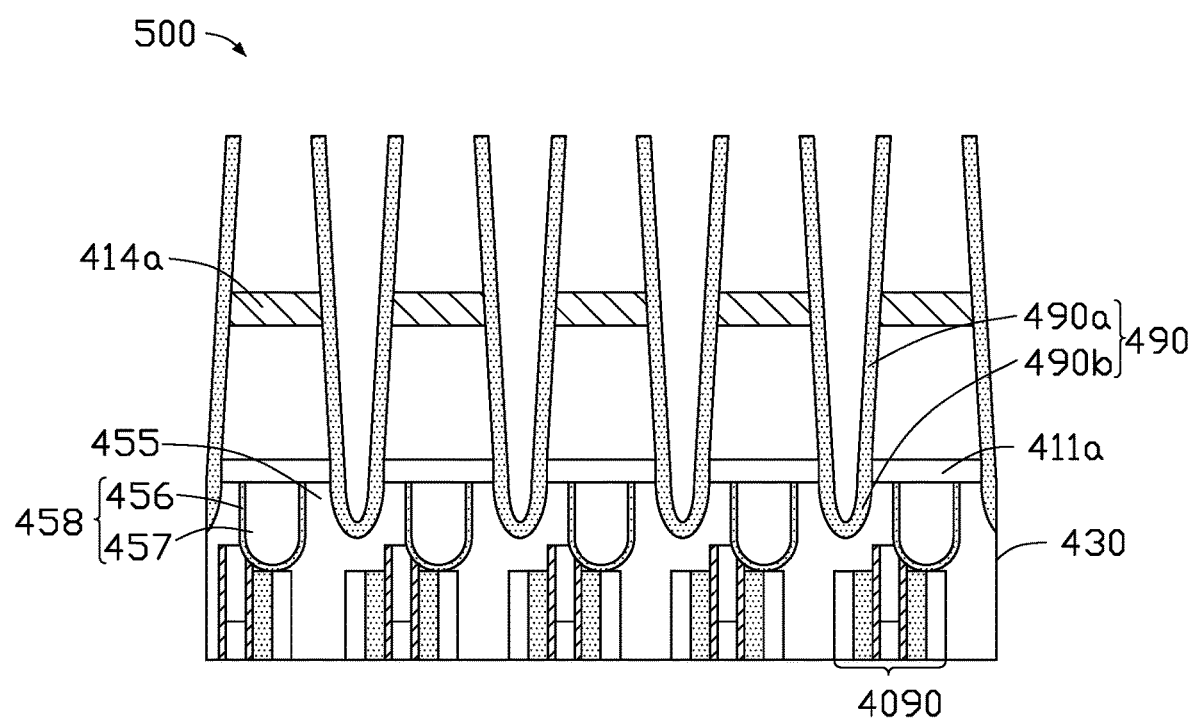

Referring to FIG. 5F, processes substantially the same as or similar to those illustrated with reference to FIG. 2H may be used to remove the mask patterns 413, the portion 416a of the first sacrificial layer 415, and the portion 415a of the second sacrificial layer 416, as shown in FIG. 5F.

In some implementations, the conductive pattern 190 has a U-shaped structure. Since the lower portion 490b contact with the landing pad 455, the conductive pattern 490 is electrically connected to the landing pad 455. Preferably, the upper portion 490a is partially surrounded by the etch stop patterns 411a at the bottom of the upper portion 490a and partially surrounded by the portion 414a of the support layer 414 at the middle of the upper portion 490a. For example, the portion 414a is connected to an outer sidewall of the upper portion 490a as shown in FIG. 5F.

Figure 6A:
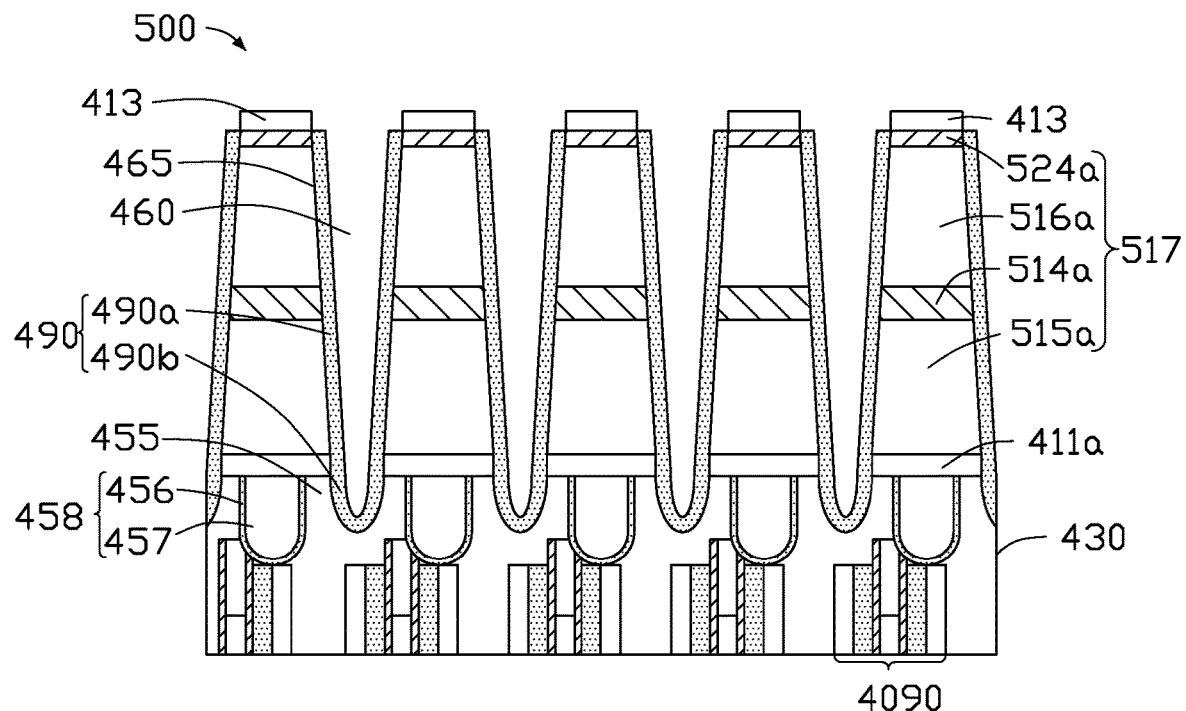
FIGS. 6A to 6B are cross-sectional views of a semiconductor device illustrating a method for fabricating a storage node with a dual horizontal support layers in the semiconductor device in accordance with a sixth implementation of the present disclosure.
Figure 6B:
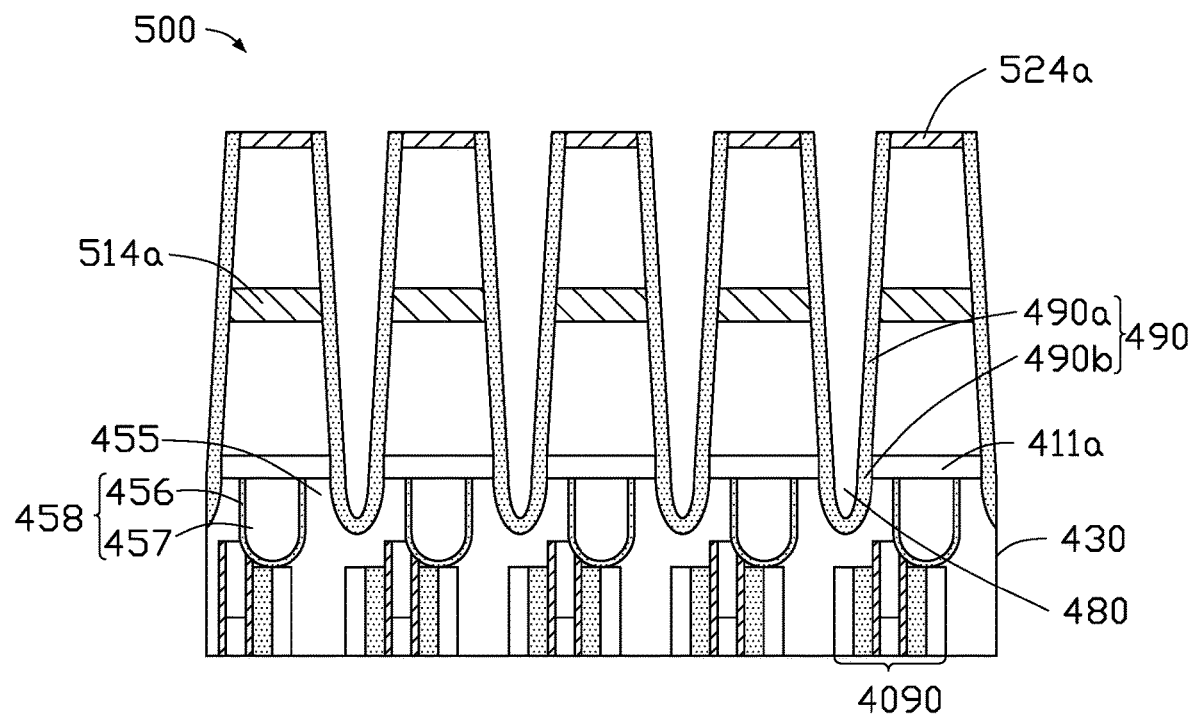

FIGS. 6A to 6B are cross-sectional views illustrating a method for fabricating a storage node with a dual horizontal support layers in a semiconductor device 600 in accordance with some implementations of the present disclosure. In FIGS. 6A to 6B, detailed descriptions regarding processes and/or materials that are substantially the same as or similar to those described above with reference to FIGS. 5A to 5F are omitted herein, and like reference numerals are used to designate like elements.

Referring to FIGS. 6A to 6B, processes substantially the same as or similar to those described in FIGS. 5A to 5F may be used to form the conductive pattern 490 as shown in FIG. 6B. The method for forming the conductive pattern 490 may include the actions of: providing a substrate 430 including a pattern formed thereon; forming an opening 460 through the pattern to expose the substrate 430; forming a dielectric layer 470 on a sidewall 465 of the opening 460; performing a dry etching process to form a hole 480 in the substrate; removing the dielectric layer 470; and depositing a conductive pattern 490 over the sidewall 465 and in the hole 480. The pattern may include an etch stop layer contacting the substrate 430, a laminate structure formed on the etch stop layer 411, and a plurality of mask patterns 413 formed over the laminate structure. The laminate structure may include tapered pillars 517 including two sacrificial layers 515a, 516a and two support layers 514a, 524a. The method may further include removing the sacrificial layers 515a, 516a by processes previously described in FIG. 5F.

According to the example implementations described with reference to FIGS. 4A to 4F and 6A to 6B, the capacitor has an improved structural stability. The lower portion 490b of the conductive pattern 190 has a hollow U-shaped structure serving as a fixture base. The support layer 414a, 514a, 524a provides horizontal support between the conductive patterns 490. The enhancement of the structural stability of the conductive pattern 490 prevents the capacitor from deformation. Furthermore, the lower portion 490b increases the contact area between the conductive pattern 490 and the landing pad 455, therefore increasing the capacitance of the capacitor.

Figure 7A:
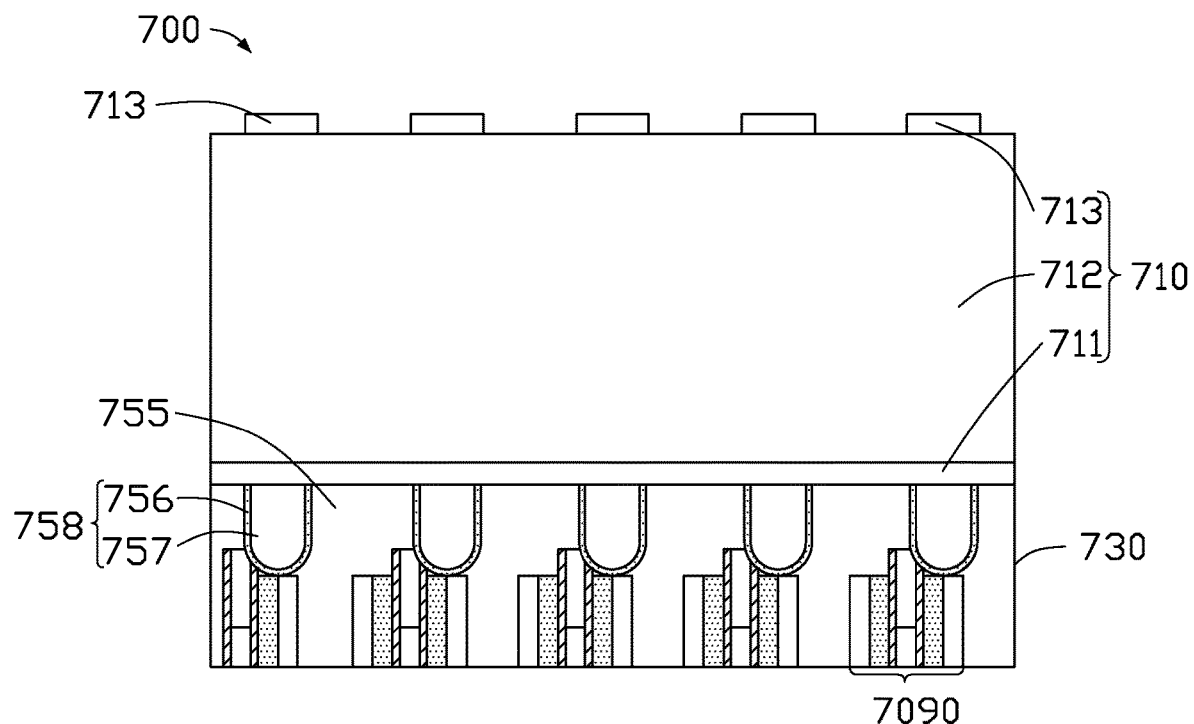
FIGS. 7A to 7H are cross-sectional views of a semiconductor device illustrating a method for fabricating a storage node in the semiconductor device in accordance with a seventh implementation of the present disclosure.

FIGS. 7A-7H are cross-sectional views illustrating a method for fabricating a storage node in a semiconductor device 700 in accordance with some implementations of the present disclosure. As shown in FIG. 7A, the semiconductor device 700 includes a substrate 730, a preliminary pattern 710 formed on the substrate 730. The semiconductor device 700 may be a dynamic random access memory (DRAM) device. The substrate 730 includes a landing pad 755, a dielectric plug 758 having a first dielectric element 756, and a second dielectric element 757. The landing pad 755 may be formed of a metal material, such as tungsten, titanium, or tantalum. The first dielectric element 756 may be formed of a dielectric material such as SiN by a CVD process. The second dielectric element 757 may be formed of a dielectric material such as SiN by an ALD process. In some implementations, the substrate 730 may be a silicon wafer. A circuit element 7090 including a gate structure, an impurity region, and/or a contact plug may be provided in the substrate 730. Further detailed descriptions regarding materials in FIG. 7A that are substantially the same as or similar to those described above with reference to FIG. 1A are omitted herein, and like reference numerals are used to designate like elements.

Figure 7B:
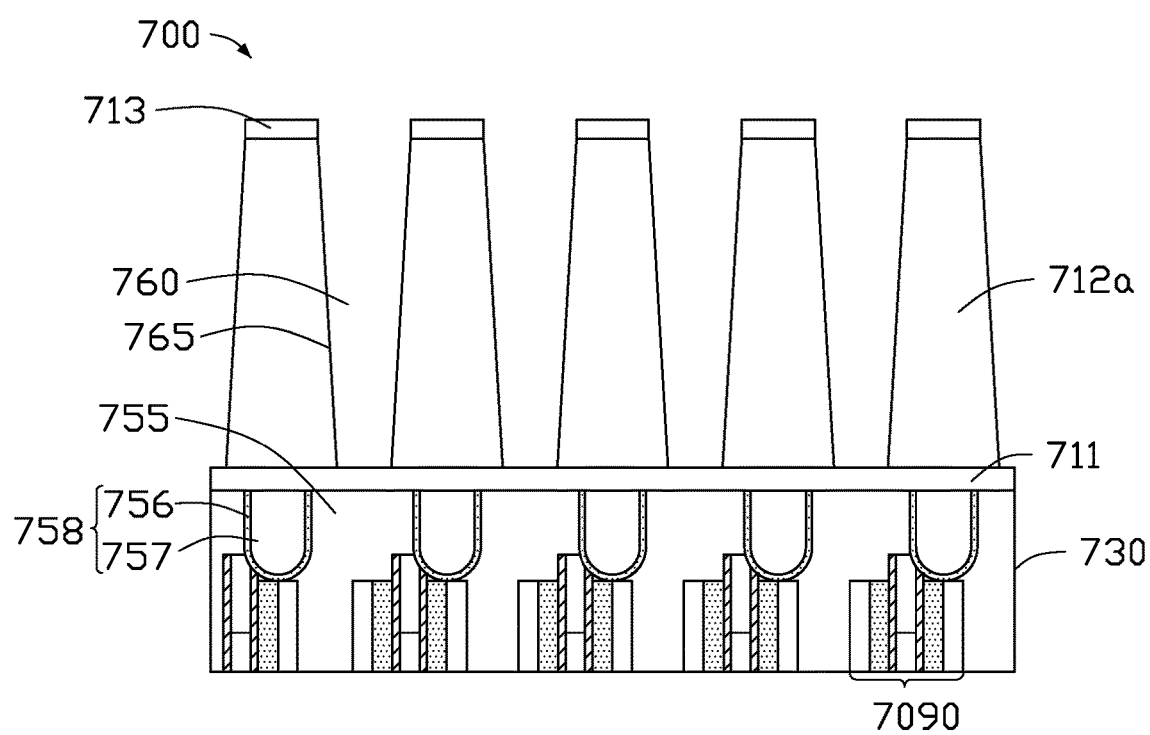

Referring to FIG. 7B, processes substantially the same as or similar to those illustrated with reference to FIG. 1B may be used to form an opening 160a as shown in FIG. 7B.

Figure 7C:
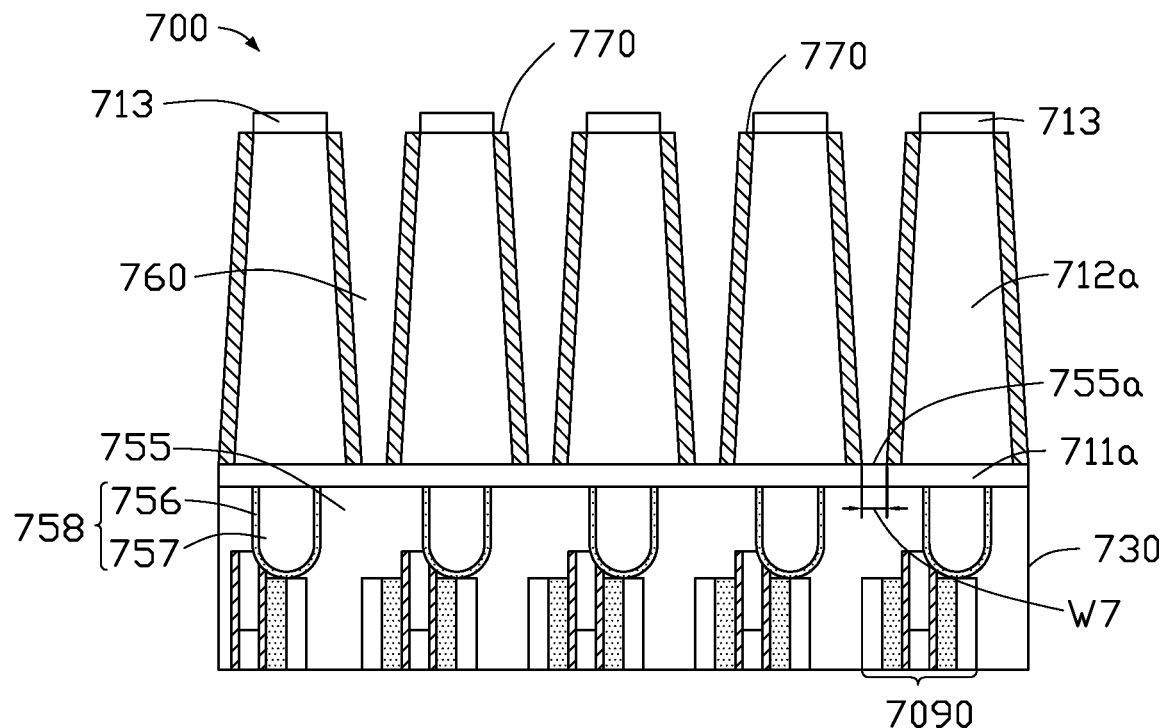

As shown in FIG. 7C, a dielectric layer 770 is formed on a sidewall 765 of the opening 760 by a deposition process such as a CVD process or ALD process. The dielectric layer 770 may be a spacer covering the tapered pillars 712a, and a portion of the etch stop patterns 711a to serve as a hard mask for the subsequent etching process. The width W7 of the non-covered area of the etch stop patterns 711a may fall in the range of 30 to 40 nanometers. Preferably, the dielectric layer 770 has a uniform thickness of 70 angstroms.

Figure 7D:
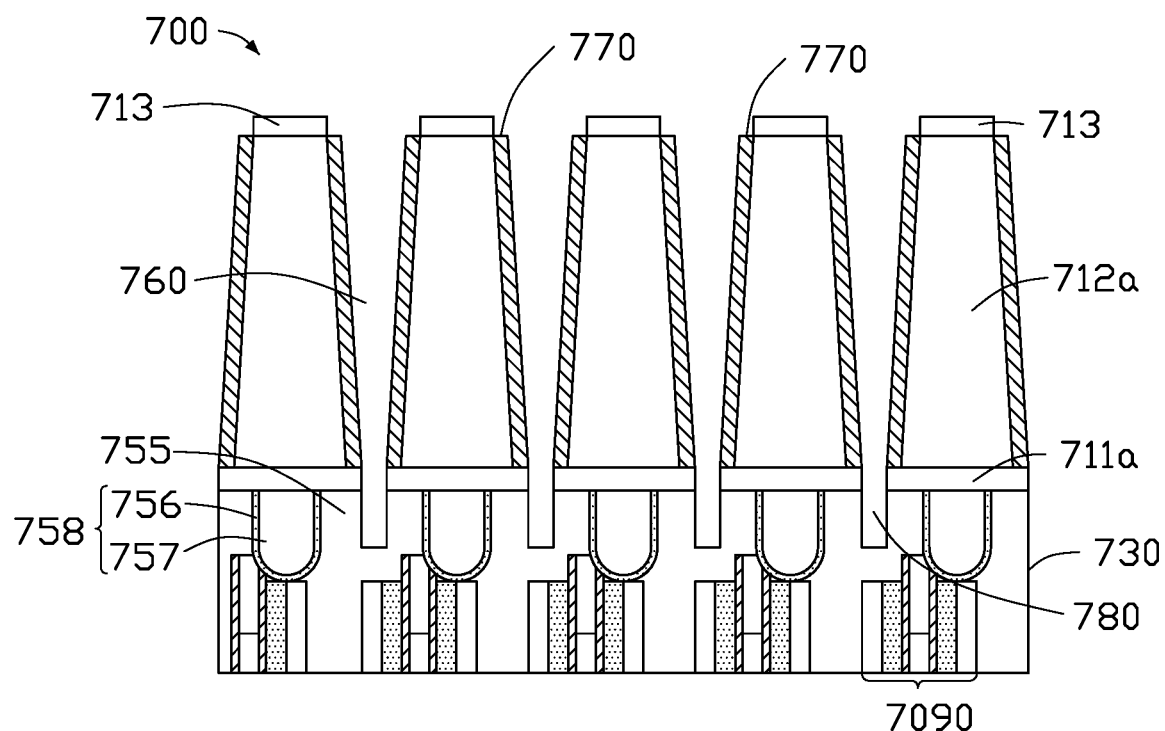

As shown in FIG. 7D, an etching process is performed to form a hole 780 in the landing pad 755. For example, a dry etching process may be performed. The hole 780 penetrates the etch stop patterns 711a and the landing pad 755 by a predetermined depth. The depth of the hole 780 may be 0.2 microns, and the width of the hole 180 may fall in the range of 30 to 40 nanometers. In some implementations, the hole 780 may be formed by a single etching process or a plurality of etching processes.

Figure 7E:
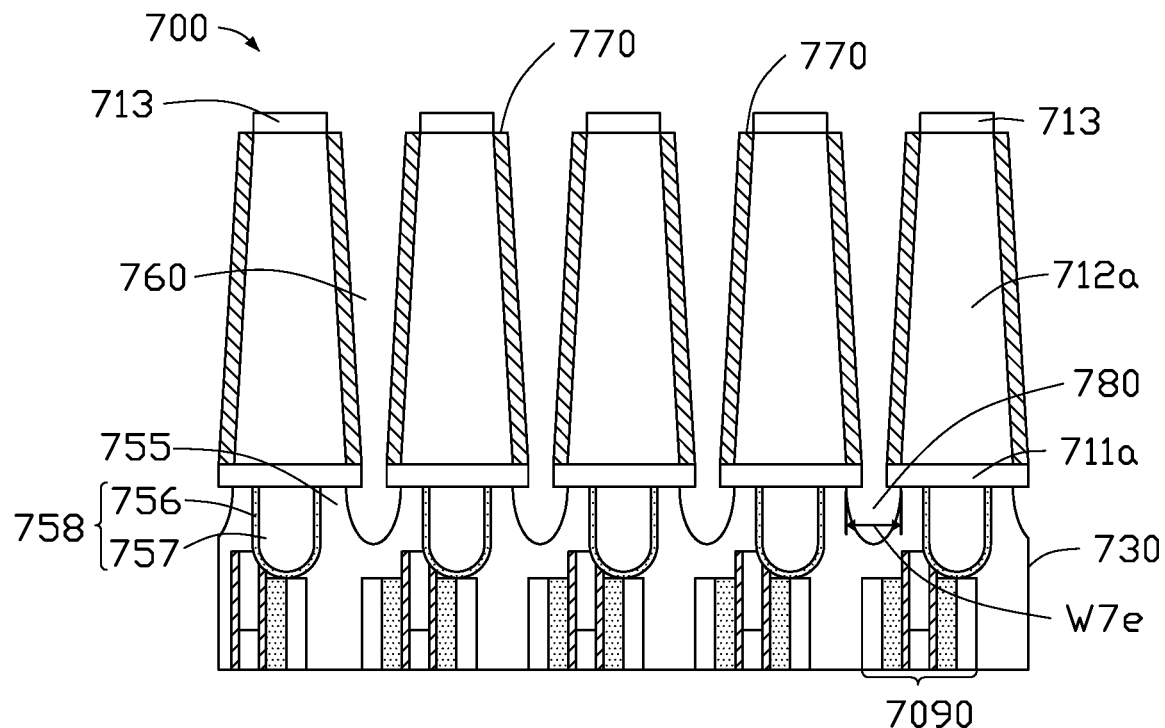

As shown in FIG. 7E, an etching process is performed to expand the hole 780 in the landing pad 755. For example, a wet etching process may be performed. The width w7e of the widest portion of the expanded hole 780 may fall in the range of 50 to 60 nanometers.

Figure 7F:
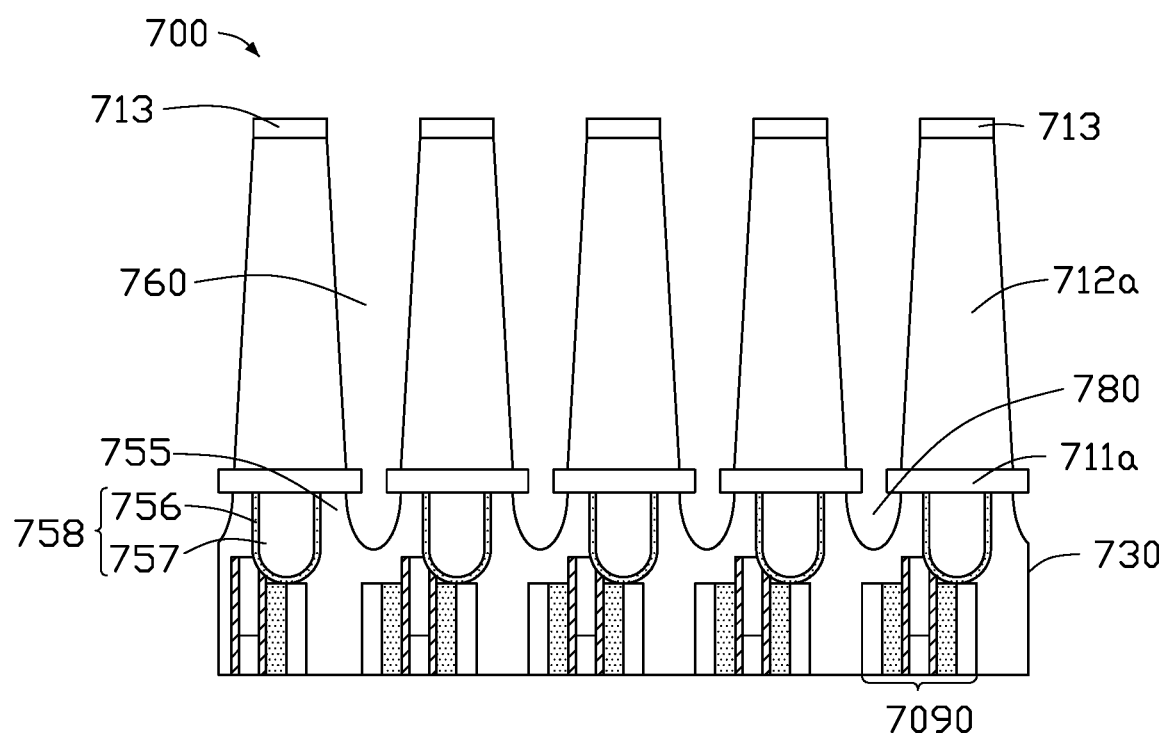

As shown in FIG. 7F, subsequent to the formation of the expanded hole 780, the dielectric layer 770 may be removed by an etching process such as a plasma etching process, an ICP process, a TCP process or a RIE process.

Figure 7G:
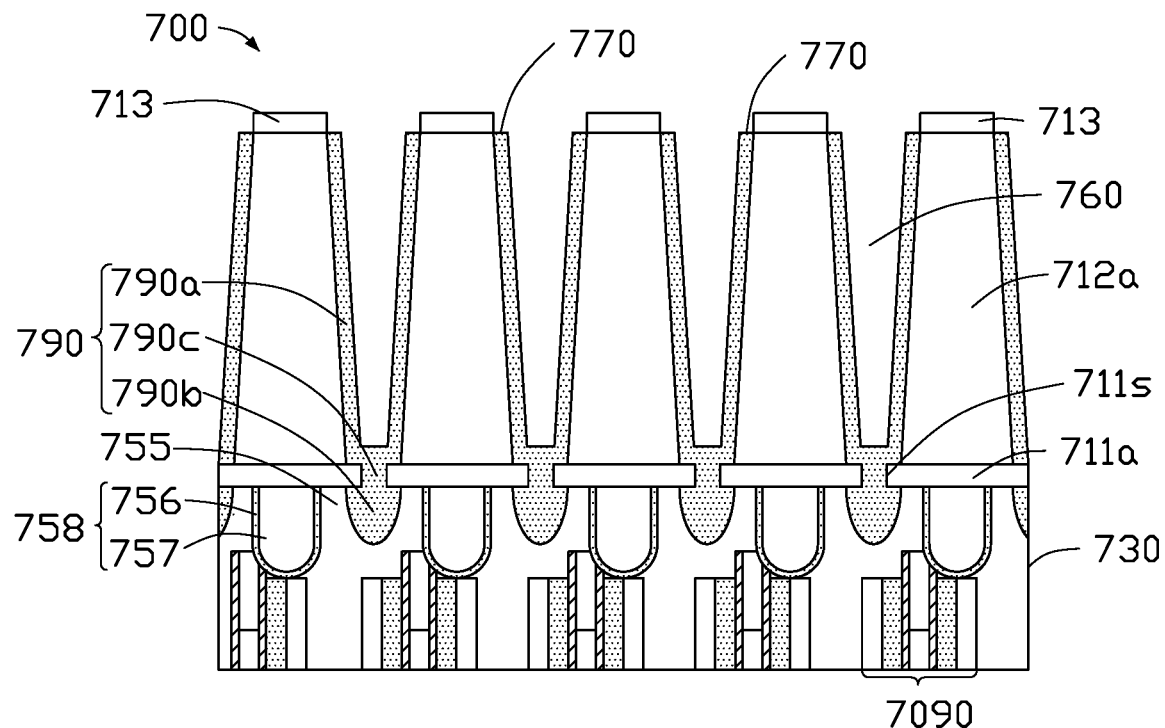

As shown in FIG. 7G, a conductive pattern 790 is formed over the substrate 730 by a deposition process, such as a CVD process or ALD process. The conductive pattern 790 may be a lower electrode or a storage node of a capacitor of the DRAM device. The conductive pattern 790 may be formed of a material, such as titanium nitride, titanium, tungsten, or the like. The conductive pattern 790 includes an upper portion 790a, a middle portion 790c and a lower portion 790b. The lower portion 190b may fill the hole 780. The middle portion 790c may be surrounded by the etch stop patterns 711a. The upper portion 790a may cover the sidewall 765 of the opening 760 and a top surface 711s of the etch stop patterns 711a. In some implementations, the conductive pattern 790 may be formed by a single deposition process or a plurality of deposition processes.

Figure 7H:
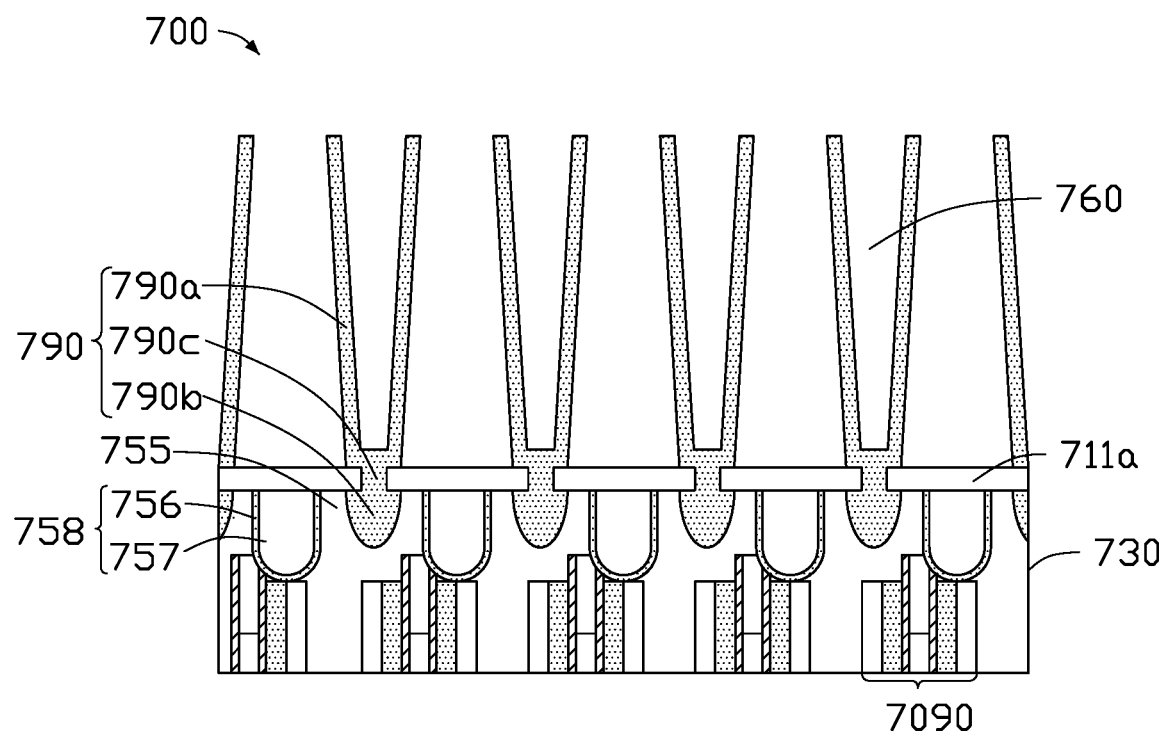

As shown in FIG. 7H, the mask patterns 713 and the tapered pillars 712a are removed. For example, the mask patterns 713 may be removed by a dry etching process, and the tapered pillars 712a may be removed by a wet etching process. In some implementations, the conductive pattern 790 is electrically connected to the landing pad 755. The upper portion 790a of the conductive pattern 790 extends upwardly from the substrate 130 and has a vertical length falling in the range of 1 to 1.3 microns. The middle portion 790c may fill the gaps within the etch stop patterns 711a. The lower portion 790b is buried in the landing pad 755 and may have a vertical length of 0.2 microns. Accordingly, a ratio of the vertical length of the upper portion 790a to the vertical length of the lower portion 790b may fall in a range of 4 to 7. Preferably, the upper portion 790a has a truncated hollow circular cone structure (not shown).

According to the example implementations described with reference to FIGS. 7A to 7H, the capacitor has an improved structural stability. The lower portion 790b of the conductive pattern 790 has a filled U-shaped structure, and the middle portion 790c of the conductive pattern 790 has a neck structure, serving as a fixture base to enhance the structural stability of the conductive pattern 190, therefore preventing the capacitor from deformation. Furthermore, the lower portion 790b increases the contact area between the conductive pattern 790 and the landing pad 755, therefore increasing the capacitance of the capacitor.

Figure 8A:
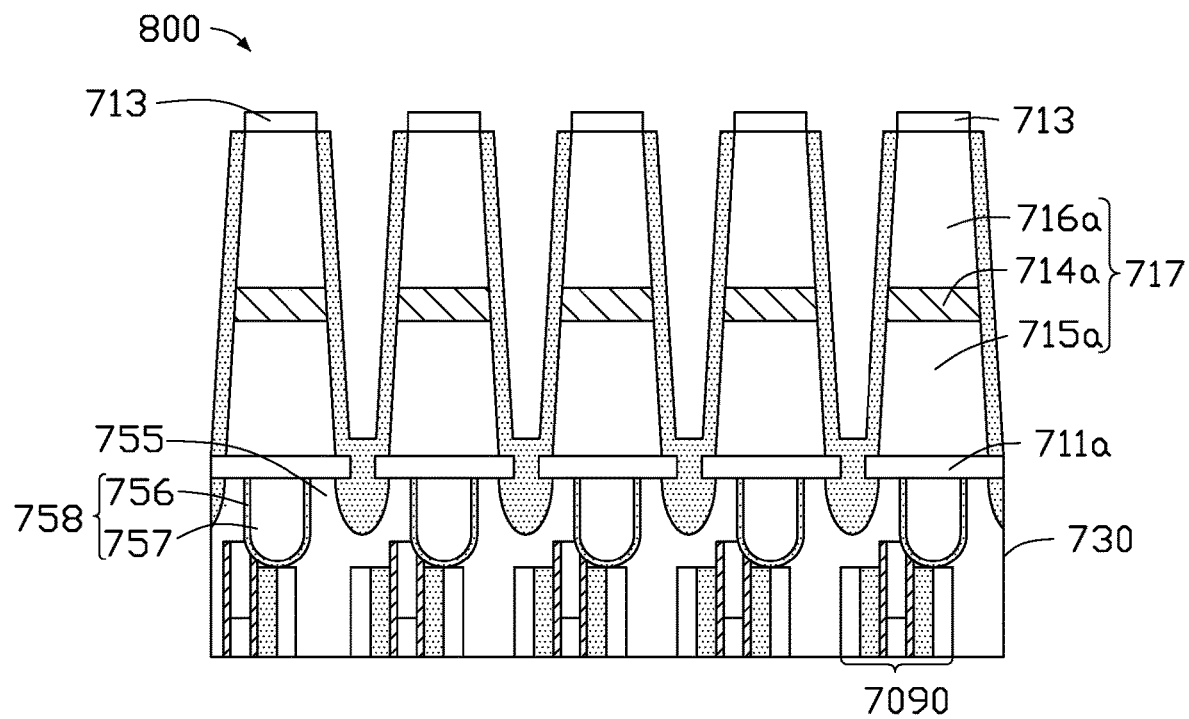
FIGS. 8A to 8B are cross-sectional views of a semiconductor device illustrating a method for fabricating a storage node with a horizontal support layer in the semiconductor device in accordance with an eighth implementation of the present disclosure.
Figure 8B:
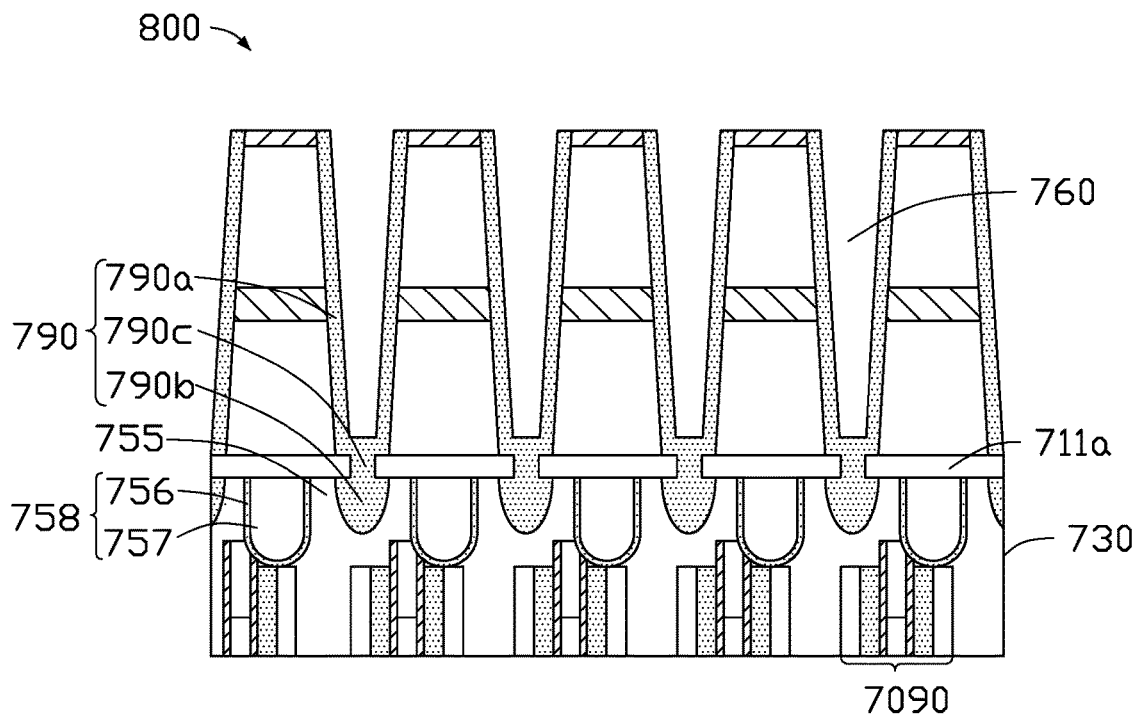

FIGS. 8A to 8B are cross-sectional views illustrating a method for fabricating a storage node with a horizontal support layer in a semiconductor device 800 in accordance with some implementations of the present disclosure. In FIGS. 8A to 8B, detailed descriptions regarding processes and/or materials that are substantially the same as or similar to those described above with reference to FIGS. 7A to 7H are omitted herein, and like reference numerals are used to designate like elements.

Referring to FIGS. 8A to 8B, processes substantially the same as or similar to those illustrated with reference to FIGS. 7A to 7H may be used to form the conductive pattern 790 as shown in FIG. 8B. The method for forming the conductive pattern 790 may include the action of: providing a substrate 730 including a preliminary pattern formed thereon; forming an opening 760 through the preliminary pattern to expose the etch stop layer 711; forming a dielectric layer 770 on a sidewall 765 of the opening 760; performing a dry etching process to form a hole 780 in the substrate 730; performing a wet etching process to expand the hole 780 in the substrate 730; removing the dielectric layer 770; and depositing a conductive pattern 790 over the sidewall 765 and in the hole 780. The preliminary pattern may include an etch stop layer contacting the substrate 730, a laminate structure formed on the etch stop layer 711, and a plurality of mask patterns 713 formed over the laminate structure. The laminate structure includes tapered pillars 717 including two sacrificial layers 715a, 716a and a support layer 714a. The method may further include removing the sacrificial layers 715a, 716a by processes previously described in FIGS. 2H and 5F.

Figure 9A:
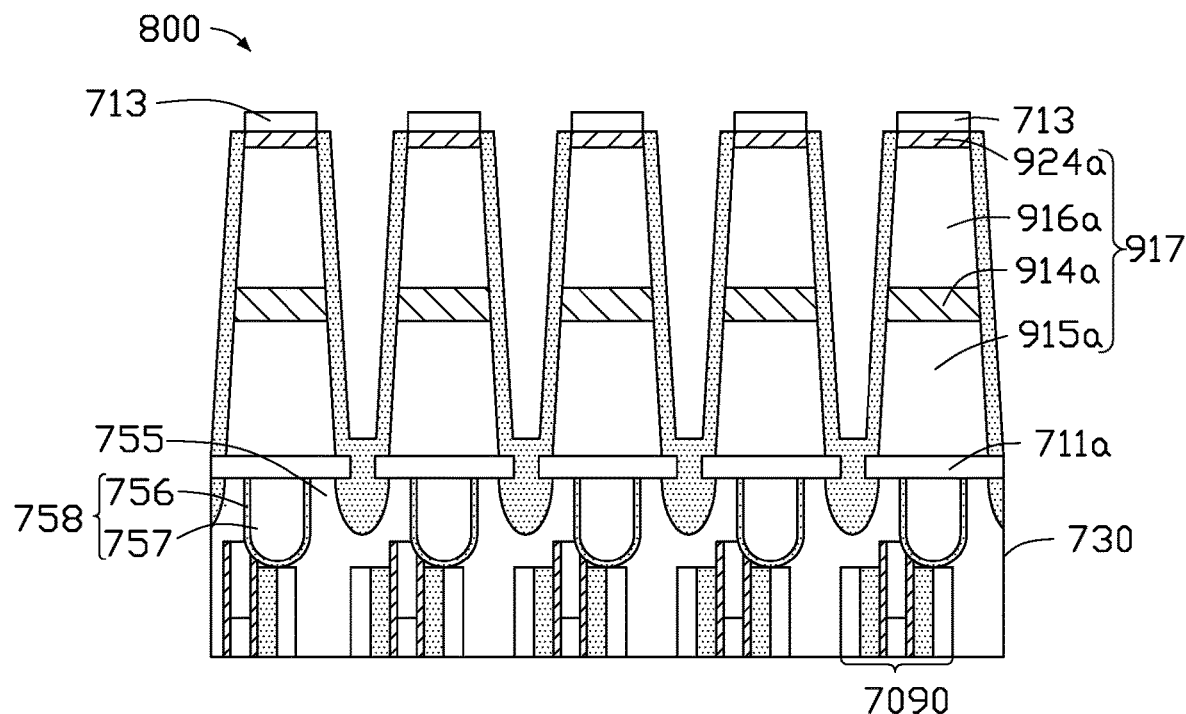
FIGS. 9A to 9B are cross-sectional views of a semiconductor device illustrating a method for fabricating a storage node with a dual horizontal support layer in the semiconductor device in accordance with a ninth implementation of the present disclosure.
Figure 9B:
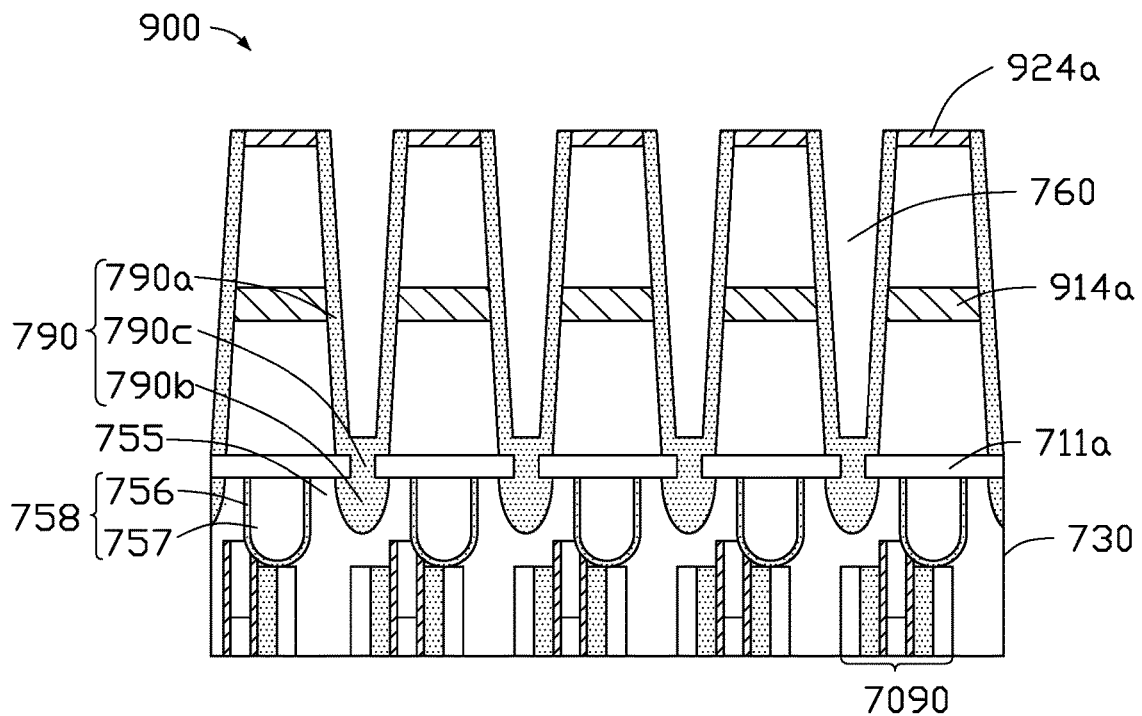

FIGS. 9A to 9B are cross-sectional views illustrating a method for fabricating a storage node with a horizontal support layer in a semiconductor device 900 in accordance with some implementations of the present disclosure. In FIGS. 9A to 9B, detailed descriptions regarding processes and/or materials that are substantially the same as or similar to those described above with reference to FIGS. 7A to 7H are omitted herein, and like reference numerals are used to designate like elements. Referring to FIGS. 9A to 9B, processes substantially the same as or similar to those illustrated with reference to FIGS. 8A to 8B may be used to form conductive pattern 790 as shown in FIG. 9B.

According to the example implementations described with reference to FIGS. 8A to 8B and 9A to 9B, the capacitor has an improved structural stability. The lower portion 790b of the conductive pattern 790 has a filled U-shaped structure, and the middle portion 790c of the conductive pattern 790 has a neck structure, serving as a fixture base. The support layer 714a, 914a, 924a provides horizontal support between the conductive patterns 790. The laminate structure includes tapered pillars 917 including two sacrificial layers 915a, 916a and the support layer 914a. The enhancement of the structural stability of the conductive pattern 790 prevents the capacitor from deformation. Furthermore, the lower portion 790b increases the contact area between the conductive pattern 790 and the landing pad 755, therefore increasing the capacitance of the capacitor.

Figure 10:
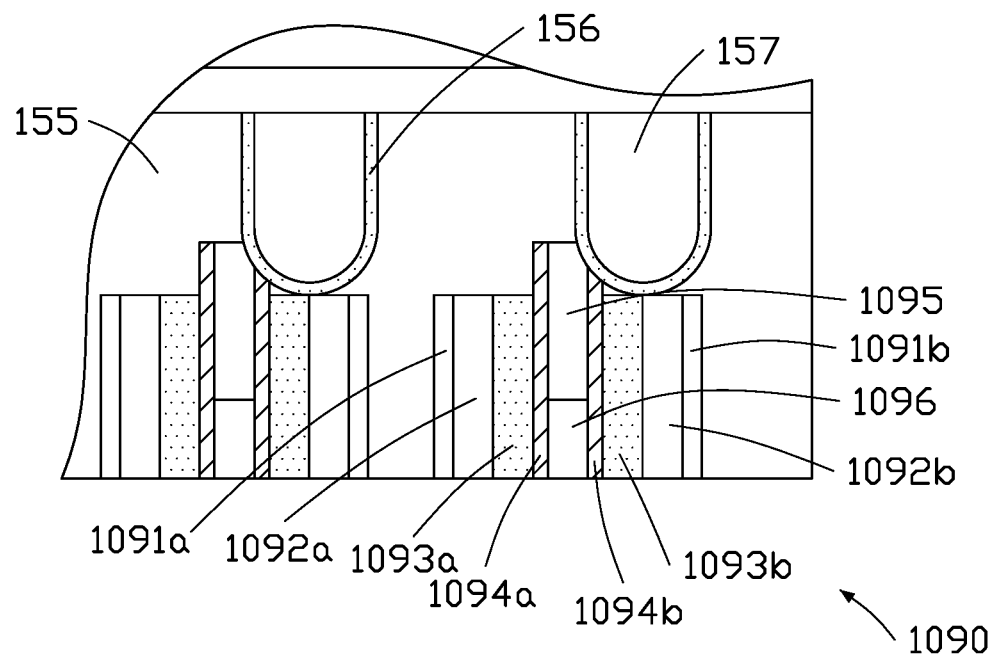
FIG. 10 is a partial cross-sectional view of a semiconductor device illustrating a circuit element in the semiconductor devices shown in FIGS. 1A to 9B.

FIG. 10 is a cross-sectional view illustrating a circuit element 1090 in the semiconductor device 100 to 900. The circuit element 1090 may include first dielectric layers 1091a, 1091b, outer spacers 1092a, 1092b, second dielectric layers 1093a, 1093b, inner spacers 1094a, 1094b, a mask 1095, and a gate line 1094. In some implementations, the first dielectric layers 1091a, 1091b, the outer spacers 1092a, 1092b, the inner spacers 1094a, 1094b, and the mask 1095 may be made of material selected from SiN, SiBN, SiCN, SiC, SiON, and SiOC. The second dielectric layer 1093 may be made of silicon oxide-based material, such as SiOx, PEOX, BSG, PSG, BPSG, TEOS, BTEOS, PTEOS, and BPTEOS. The space filled by the second dielectric layers 1093a, 1093b may be air-gaps when the second dielectric layers 1093a, 109b are removed. The gate line 1096 may be made of a metal material, such as tungsten, titanium, or tantalum.

The terminology used herein is for the purpose of describing particular implementations only and is not intended to be limiting of implementations of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, actions, operations, elements, and/or components, but do not preclude the presence or addition of one or more other features, integers, actions, operations, elements, components, and/or groups thereof.

The corresponding structures, materials, acts, and equivalents of all means or action plus function elements in the claims below are intended to include any structure, material, or act for performing the function in combination with other claimed elements as specifically claimed. The description of the present disclosure has been presented for purposes of illustration and description, but is not intended to be exhaustive or limited to implementations of the present disclosure in the form disclosed. Many modifications and variations will be apparent to those of ordinary skill in the art without departing from the scope and spirit of implementations of the present disclosure. The implementation was chosen and described in order to best explain the principles of implementations of the present disclosure and the practical application, and to enable others of ordinary skill in the art to understand implementations of the present disclosure for various implementations with various modifications as are suited to the particular use contemplated.

Although specific implementations have been illustrated and described herein, those of ordinary skill in the art appreciate that any arrangement which is calculated to achieve the same purpose may be substituted for the specific implementations shown and that implementations of the present disclosure have other applications in other environments. This present disclosure is intended to cover any adaptations or variations of the present disclosure. The following claims are in no way intended to limit the scope of implementations of the present disclosure to the specific implementations described herein.

Various examples have been described. These and other examples are within the scope of the following claims.

What is claimed is:

1. A method for fabricating a semiconductor device, comprising:

providing a substrate comprising a preliminary pattern formed thereon;

forming an opening through the preliminary pattern to expose a conductive portion in the substrate;

forming a dielectric layer on a sidewall of the opening; performing a dry etching process to form a hole in the conductive portion; removing the dielectric layer; and depositing a conductive pattern over the sidewall of the opening and in the hole after removing the dielectric layer.

2. The method of claim 1, wherein the preliminary pattern on the substrate comprises: an etch stop layer contacting the substrate; a sacrificial layer formed on the etch stop layer; and a plurality of mask patterns formed over the sacrificial layer.

3. The method of claim 2, wherein forming the opening comprises: forming a tapered trench in the sacrificial layer to expose the etch stop layer; and forming a recess in the etch stop layer to expose a top surface of the conductive portion.

4. The method of claim 2, further comprising: removing the plurality of mask patterns by another dry etching process; and removing the sacrificial layer by a wet etching process after depositing the conductive pattern.

5. The method of claim 1, wherein the preliminary pattern on the substrate comprises: an etch stop layer contacting the substrate; a laminate structure formed on the etch stop layer, the laminate structure comprising at least one sacrificial layer and at least one support layer; and a plurality of mask patterns formed over the laminate structure.

6. The method of claim 5, wherein the at least one support layer comprises silicon nitride (SiN) or silicon carbon nitride (SiCN).

7. The method of claim 5, further comprising: removing the plurality of mask patterns by another dry etching process; and removing the at least one sacrificial layer by a wet etching process.

8. The method of claim 1, wherein the conductive pattern comprises a material selected from titanium nitride (TiN), titanium (Ti), and tungsten (W).

* * * * *